(12) United States Patent
Wang et al.

(10) Patent No.: US 8,831,917 B2
(45) Date of Patent: Sep. 9, 2014

(54) SYSTEM AND METHOD FOR ANALYZING SPIRAL RESONATORS

(75) Inventors: Bingnan Wang, Boston, MA (US); David Ellstein, Centerport, NY (US); Koon Hoo Teo, Lexington, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 290 days.

(21) Appl. No.: 13/430,944

(22) Filed: Mar. 27, 2012

(65) Prior Publication Data

US 2013/0144588 A1 Jun. 6, 2013

Related U.S. Application Data

(60) Provisional application No. 61/565,711, filed on Dec. 1, 2011.

(51) Int. Cl.
*G06F 17/50* (2006.01)
(52) U.S. Cl.
USPC .............. 703/2; 703/17; 307/104; 342/198
(58) Field of Classification Search
USPC .................... 703/2, 17; 307/104; 342/198
See application file for complete search history.

(56) References Cited

U.S. PATENT DOCUMENTS

| | | | | |
|---|---|---|---|---|
| 7,154,349 | B2 * | 12/2006 | Cabanillas | 331/117 R |
| 7,773,033 | B2 * | 8/2010 | Morton et al. | 342/198 |
| 8,351,867 | B2 * | 1/2013 | Wachi | 455/76 |
| 2010/0109445 | A1 * | 5/2010 | Kurs et al. | 307/104 |
| 2010/0248647 | A1 * | 9/2010 | Wachi | 455/73 |
| 2010/0263199 | A1 * | 10/2010 | Morton et al. | 29/600 |

* cited by examiner

*Primary Examiner* — Thai Phan
(74) *Attorney, Agent, or Firm* — Dirk Brinkman; Gene Vinokur

(57) ABSTRACT

A spiral resonator is analyzed by modeling a set of loops of the spiral resonator with a model of a circuit including a set of units, wherein each unit includes a resistor and an inductor to model one loop of the spiral resonator. Values of the resistor and the inductor of each unit are based on properties of a corresponding loop. Electrical connection of the loops is modeled by electrically connecting the units in a corresponding order of the loops. A capacitive coupling in the spiral resonator is modeled by connecting adjacent units with at least one capacitor having a value based on the capacitive coupling between two corresponding adjacent loops. An inductive coupling in the spiral resonator is modeled based on inductive coupling between pairs of loops. The operation of the spiral resonator is simulated with the model of the circuit.

10 Claims, 27 Drawing Sheets

| Description | Value |
|---|---|
| Type | Single Spiral |
| Shape | Square Spiral |
| Number of Loops | 4 |
| Outermost Dimension | 25mm |
| Loop Spacing | 0.5mm |
| Spiral on Dielectric Slab<br>Dielectric Constant<br>Thickness of Slab | 3.48<br>0.5mm |
| Wire Shape<br>Gauge or width & thickness | Trace (rectangular cross section)<br>0.5mm & 0.035mm |
| Wire Material<br>Conductivity | Copper<br>5.85E7 |

FIG. 7A

| Description | Value |
|---|---|
| Type | Loop Antenna |
| Shape | Square |
| Number of Loops | 1 |
| Outermost Dimension | 35mm |
| Loop on Dielectric Slab<br>Dielectric Constant<br>Thickness of Slab | 3.48<br>0.5mm |
| Wire Shape<br>Gauge or width & thickness | Trace (rectangular cross section)<br>1mm & 0.035mm |
| Wire Material<br>Conductivity | Copper<br>5.85E7 |

FIG. 7B

| Description | Value |
|---|---|
| Type | Double Spiral |
| Shape | Square Spiral |
| Number of Loops | 5 (per spiral) |
| Outermost Dimension | 25mm |
| Loop Spacing | 0.5mm |
| Spiral on Dielectric Slab Dielectric Constant Thickness of Slab | 3.48 0.5mm |
| Wire Shape Gauge or width & thickness | Trace (rectangular cross section) 0.5mm & 0.035mm |
| Wire Material Conductivity | Copper 5.85E7 |

SYSTEM AND METHOD FOR ANALYZING SPIRAL RESONATORS

RELATED APPLICATION

This Application claims priority to U.S. Provisional Patent entitled, "Method for Modeling Spiral Resonators" Application No. 61/565,711, filed on Dec. 1, 2011. The provisional application is incorporated herein by reference.

FIELD OF THE INVENTION

This invention relates generally to systems and methods for analyzing spiral resonators, and more particularly to modeling and analyzing the spiral resonators based on circuit topologies.

BACKGROUND OF THE INVENTION

Spiral Resonators

Spiral resonators have a conductive material (wire(s)) with a spiral structure designed to resonate at one or multiple frequencies. The value of spiral resonators can be shown through their application to both a single layer spiral and a double layer spiral resonators. FIG. 1A shows an example of two common single layer spiral structures, i.e., a square spiral 105 and an Archimedes spiral 110. All the wires of the single layer spiral are arranged in the same plane.

FIG. 1B shows an example of two common double layer spiral structures, 130 and 140. The double layer spiral resonator includes two single layer spiral structures 135 and 136 on separate but parallel planes. A direction of the winding directions of the two spiral resonators of each double layer spiral are opposite one another. The double layer spiral resonator includes two spiral resonators, which can be connected by inner or outer leads. This connection is referred to as a via. In example of FIG. 1B, the resonator 140 includes via 150 connecting the inner leads of the spiral.

In general, a resonant frequency of a system is the frequency at which energy naturally oscillates between two different forms. In the context of spiral resonators, this means the energy is transferred back and forth between the electric field and the magnetic field.

The resonant frequency of the spiral resonator is used in many applications. For example, in electrical engineering applications, spiral resonators are used as a pass band filter, i.e., the spiral resonator only allows frequencies within a specific bandwidth about its resonant frequency to pass through the system to which the resonator is connected.

In the application of wireless energy transfer, the spiral resonators are used as transmitters and receivers, wherein only near the resonant frequency the energy is transferred efficiently between the transmitter and the receiver. In the field of applied physics, materials with unusual properties, such as negative index of refraction, known as metamaterials are often composed of spiral resonators. The proper design of the metamaterial requires knowledge of the resonant frequency of the constituent spiral resonators.

In biomedical engineering applications, dependence of the resonant frequency of the double layer spiral resonator on the separation distance between the two composing spiral resonators is used for sensing. The resonant frequency of the double layer spiral resonator (with or without the via) changes monotonically as the distance between the spiral resonators is decreased. The resonant frequency of the double layer spiral resonator can be sensed by an antenna such as a loop antenna. Thus, the separation distance between the plates can be indirectly sensed by the antenna.

Measuring the Resonant Frequency of a Spiral Resonator

The resonant frequency of the spiral resonator is determined by geometry and material properties of its components. Typically, an external system is used to determine the resonant frequency experimentally. The external system inputs electromagnetic energy into the spiral resonator and measures the resulting properties of the system. The resonant frequency of the spiral resonator manifests in other properties or electromagnetic behaviors of the spiral or a system interacting with the spiral resonator such as an antenna. These properties can be used to define the resonant frequency of the spiral resonator for measurement purposes. There are two conventional methods for measuring the resonant frequency of spiral resonators. These methods do not necessarily produce the same result.

In one method, a voltage source is connected to the leads of the spiral resonator. For the case of the double layer spiral resonator, this method is used when the two spiral resonators are connected by the via between their inner or outer leads. The resonant frequency is defined as the frequency in which the spiral resonator has a local maximum in its input impedance with respect to the voltage source. The resonant frequency can also be defined as the frequency in which an imaginary component of the input impedance switches polarities, i.e., crosses a value of zero.

In another method of measuring the resonant frequency of the spiral resonator, the spiral resonator is excited by a loop antenna through magnetic induction. The loop antenna can be powered by the voltage source. The resonant frequency is the frequency at which the magnitude of the parameter describing the system with respect to the voltage source has a local minimum.

Methods for Modeling Spiral Resonators

There are multiple methods for modeling the spiral resonators. However, those models are insufficient for some applications. The inadequacies of the models can be due either to their inaccuracy or their excessive computational time, memory requirement, and cost. The existing models can be categorized into two groups; i.e., numerical electromagnetic models, and quasi-static circuit models (circuit models). Those models may use a theoretical version of the measurement methods of the resonant frequencies.

Numerical electromagnetic methods can be accurate and precise for analyzing the electromagnetic behavior of spirals resonators of a great range of geometries and materials. Those methods apply Maxwell's equations to solve for the desired characteristics of the system, such as the current distribution, or its resonant frequency.

Common techniques for solving Maxwell's equations numerically include a method of moments, a finite elements method, and a finite difference method. Unfortunately, those methods require excessive computational time and memory. The relationship between the computational time and memory requirement is dependent on the type of the resonator and numerical technique being used.

Instead of using Maxwell's equations in their exact form, the circuit techniques use a quasi-static approximation of Maxwell's equations for generating a circuit representation of the system. Based on an understanding and intuition of the consequences of Maxwell's equations, a model of the system is created. Although the model is not rigorously derived from the foundational laws and the Maxwell's equations, the model can be accurate for some classes of systems. However, because the derivation of the model from Maxwell's equations is approximate, multiple circuit models of the system are sometimes required.

There are some advantageous aspects of circuit models. First, the circuit models can serve as a simpler model to conceptualize the electromagnetic behavior of the system. Secondly, the generation of the model does not require a sophisticated method in contrast to numerical electromagnetic methods. Lastly, the circuit model often requires significantly less computation time and memory than numerical electromagnetic methods.

Existing Circuit Models of Spiral Resonators

Although circuit models can model spiral resonators, those models can be inaccurate. Additionally or alternatively, the circuit model may be accurate for a specific geometry of spiral resonators, but be inaccurate or even inapplicable to another spiral resonator with a slight change in the geometry. This inaccuracy is not surprising since the conventional models tend to oversimplify the complexity of the system.

FIG. 1C shows one prior art model of the spiral resonator that uses a single tank circuit 170. The tank circuit includes a capacitor, 185, in parallel with the series combination of a resistor 175, and an inductor 180. This tank circuit model assumes a uniform current density throughout the length of the spiral(s). This assumption is incorrect, and such model is not always optimal.

Accordingly, there is a need to improve the analysis of spiral resonators with the circuit topology.

SUMMARY OF INVENTION

It is an object of the invention to provide a method for analyzing a spiral resonator. It is further object of the invention to provide such method that considers operational relationship among components of the spiral resonator.

The embodiments of the invention are based on a realization that a more accurate circuit model of the spiral resonator can be formed by modeling each loop of the spiral resonator as a separate unit. The unit can be modeled as a connection of a resistor and an inductor in series. In some embodiments, the order of the resistor and the inductor is irrelevant.

Some embodiments of the invention are based on another realization that if the loops are connected in a specific order to form the resonator, then the units modeling each loop are also electrically connected in the same order.

Some embodiments of the invention are based on another realization that there are two types of electromagnetic interactions between the loops of the spiral resonator (the units): capacitive coupling, and inductive coupling. Capacitive coupling between loops can be modeled using one or more capacitors connecting the units. Inductive coupling between loops can be modeled as a mutual inductance between the inductors composing the units.

Some embodiments of the invention are based on another realization that only the capacitance between nearby loops needs to be modeled. In other words, the capacitance between loops is related to electric filed which decreases as the inverse square of the distance between the loops. However, the capacitance is also a function of dielectric properties of nearby materials. Thus, the evaluation of which capacitive coupling is necessary to be modeled can account for the dielectric materials.

In some embodiments, for every capacitor added to a model an additional current pathway is added, and an additional current parameter is used. Because the computational demands increase approximately exponentially with the number of current pathways, it is an advantage not to model the capacitance between units when the capacitance is relatively small. Thus, some embodiments model the capacitance only between adjacent loops.

Some embodiments of the invention are based on another realization that modeling the capacitance between two loops using two capacitors can better reproduce the distributed nature of the capacitance than using one capacitor. Thus, the capacitance between two loops is modeled using two capacitors, each having values of half of the total capacitance between the two loops. Each capacitor connects one end of one of the units to the end of the other unit that is physically (not necessary in the circuit model) near to the respective end of the first unit. These capacitors represent the proximity of the loops.

Some embodiments of the invention are based on another realization that the inductive coupling between nearby loops is most significant. In some applications, ferromagnetic material, such as iron may be placed inside the spiral resonator in order to increase the self-inductance of each unit and the inductive coupling (mutual inductance) between pairs of loops. Thus, the evaluation of which inductive coupling is necessary to model can account for the presence of ferromagnetic materials. Unlike capacitive coupling, magnetic coupling can be modeled for all loops without increasing the demands for the analysis of the model significantly. The addition of mutual inductance, i.e., the inductive coupling, between two loops does not add a pathway in the circuit model. Thus, the number of current parameters may not increase. As a result, some embodiments model the inductive coupling between pairs of some or all loops. Such modeling of the inductive coupling can improve the accuracy of the model of the circuit.

Some embodiments of the invention are based on another realization that the shape of each loop can be approximated by another geometry to simplify the process of calculating parameters of the circuit model. The parameters of the circuit model can include resistance and self-inductance of each unit, and the capacitance and mutual coupling between units.

Analytical models for calculating parameters exist for basic geometries, such as circles and squares. However, the loops of a spiral resonator differ from those basic geometries. Despite those differences, some embodiments approximate the loops as one of these basic geometries, and use one of the analytical models to approximate the parameters of the model of the circuit.

Some embodiments of the invention are based on another realization that a via between two or more spiral resonators can be modeled with a simple modification of the circuit model for the case without the via. The circuit model individualizes the loops such that locations in the physical spiral resonators correspond to locations in the circuit model. Thus, the addition of the via can be modeled by connecting the corresponding locations in the circuit model, e.g., using an ideal wire with no resistance, or a low impedance resistor.

Accordingly, one embodiment discloses a method for analyzing a spiral resonator. The method includes modeling a set of loops of the spiral resonator with a model of a circuit including a set of units, wherein each unit includes a resistor and an inductor to model one loop of the spiral resonator; determining values of the resistor and the inductor of each unit based on properties of a corresponding loop; modeling electrical connection of the loops by electrically connecting the units in a corresponding order of the loops; modeling a capacitive coupling in the spiral resonator by connecting adjacent units with at least one capacitor having a value based on the capacitive coupling between two corresponding adjacent loops; modeling an inductive coupling in the spiral resonator based on inductive coupling between pairs of loops; and simulating an operation of the spiral resonator with the model of the circuit. The steps of the method are performed by a processor.

Another embodiment discloses a system for analyzing a spiral resonator including a processor for simulating an operation of the spiral resonator using a model of a circuit formed by a set of units, wherein each unit includes a resistor and an inductor connected in series, wherein adjacent units are connected with a wire, and wherein the adjacent units are further connected with two capacitors, each capacitor connects proximate ends of the adjacent units.

Yet another embodiment discloses a method for simulating an operation of a spiral resonator. The method includes representing the spiral resonator as a model of a circuit formed by a set of units corresponding to a set of loops of the spiral resonator, such that each unit includes a resistor and an inductor represents one loop of the spiral resonator, and wherein values of the resistor and the inductor are determined based on geometry and a material property of the loop; and exciting the model of the circuit to analyze the spiral resonator.

BRIEF DESCRIPTION OF THE DRAWINGS

FIGS. 7A-B is a table of descriptions and values of components a system simulated by some embodiments of the invention;

FIG. 9A is a table 910 describing geometry and parameters of a five loop double layer square spiral resonator analyzed using some embodiments of the invention.

FIGS. 9A-B are examples of a system simulated by some embodiments of the invention;

DETAILED DESCRIPTION OF THE PREFERRED EMBODIMENT

Figure 1A:
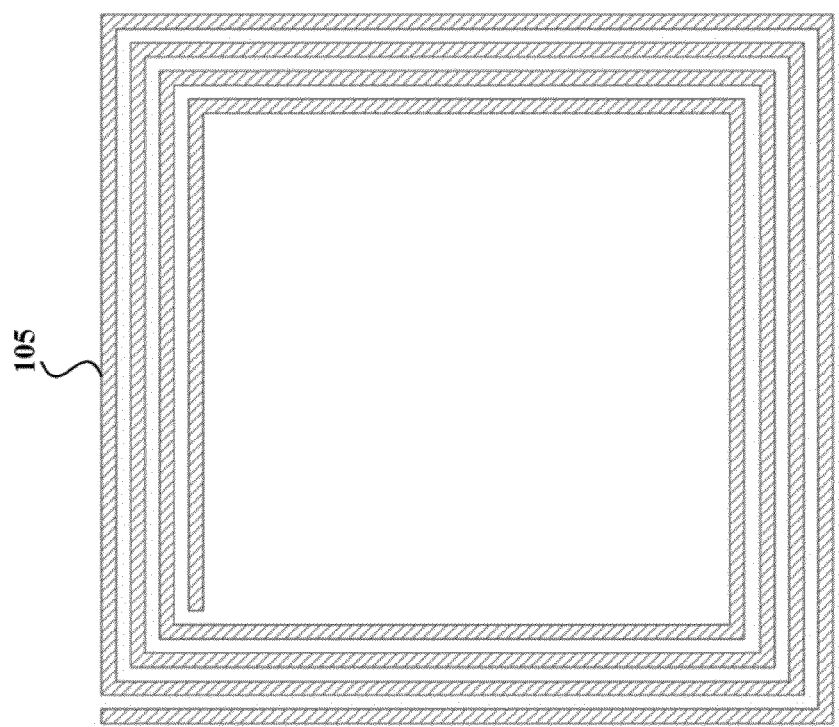
FIGS. 1A-B are schematics of examples of prior art spiral structures.
Figure 1A:
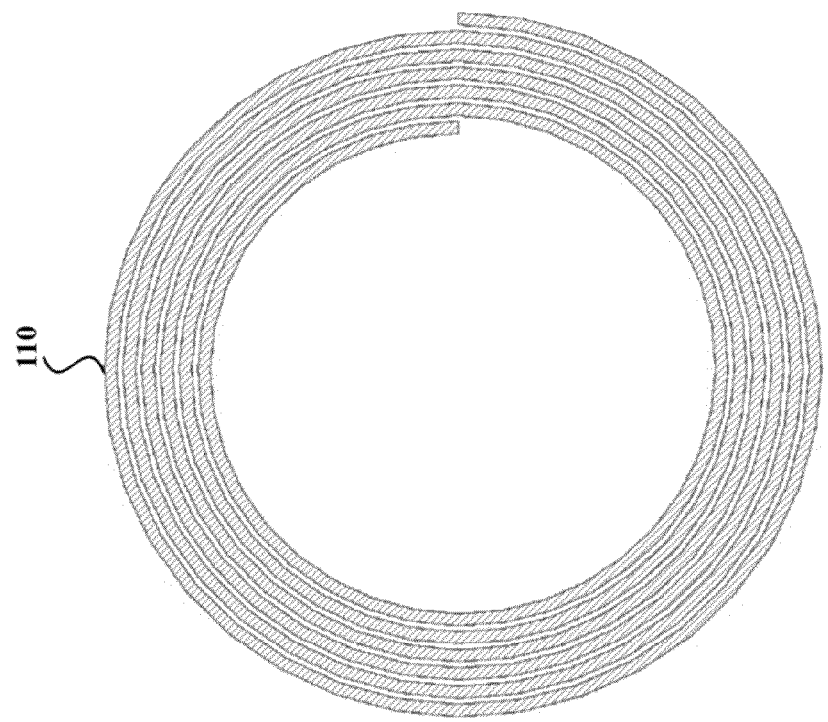
Figure 1B:
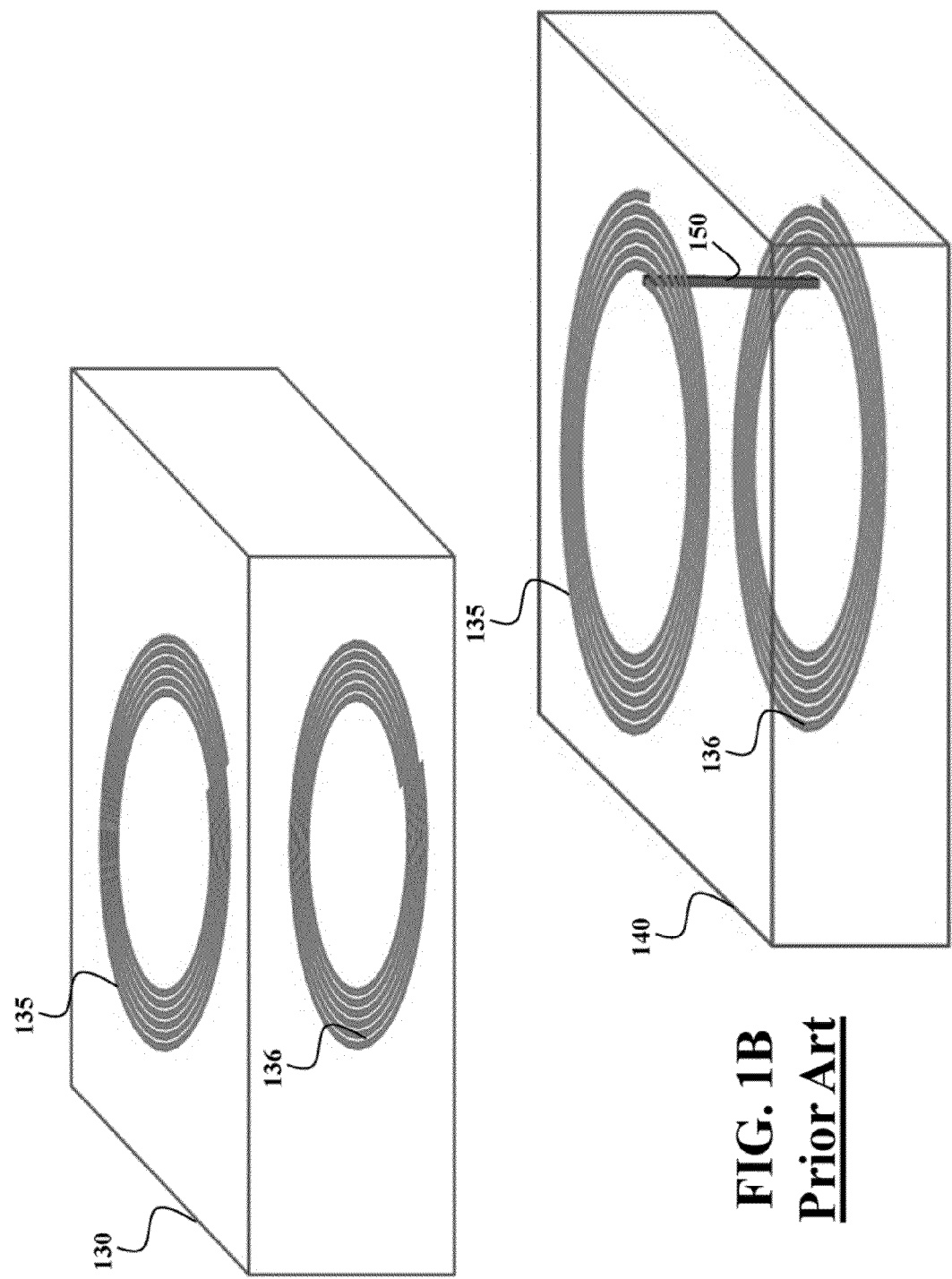
Figure 1C:
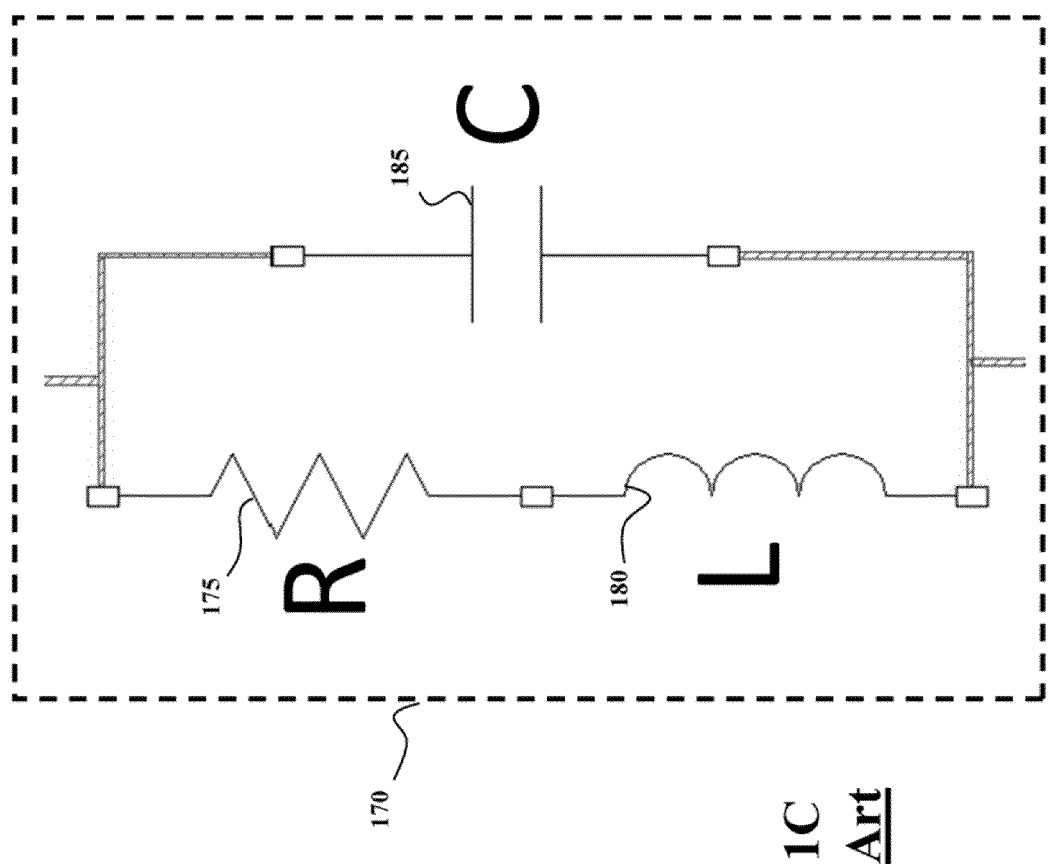
FIG. 1C is a schematic of an example of a prior art tank circuit model.

The embodiments of the invention provide a method for analyzing a spiral resonator.

Problem Formulation

A tank circuit model for analyzing a spiral resonator assumes a uniform current density throughout the length of the spiral(s). This assumption is incorrect, because the current density distribution resembles a standing wave in which the nodes of the standing wave are located at the open leads of the spiral resonator.

Another problem with the tank circuit model is that the model cannot be used to gain insight into the electromagnetic properties of each loop of the spiral resonator and the interaction between the loops. The tank circuit model is like a black box in which the geometric properties of the spiral resonator are the inputs and only the resonant frequency of the spiral resonator is the output. An additional flaw in the tank circuit model of a spiral resonator is that it implicitly implies that a spiral resonator only has a single resonant frequency. However, spiral resonators generally can have multiple resonant frequencies. The only resonant frequency, f, of the tank circuit model is at the frequency inversely proportional to the square root of the product of the inductance and capacitance in the tank circuit model. The expression for the resonant frequency is $$f = \frac{1}{2\pi\sqrt{L \cdot C}}. \tag{100}$$

Lastly, those circuit models are not easy to use for an accurate prediction of the interaction of a spiral resonator with other electromagnetic systems such as other spiral resonators or an antenna. This is unfortunate for many applications, such as in wireless power transfer using an array of spiral resonators.

Some embodiments of the invention are motivated by two applied electromagnetic problems. For example, in one method of wirelessly powering a vehicle, the path of the vehicle includes an array of spiral resonators. Power is transferred between the spiral resonators of the array such that the vehicle can receive power along its path.

However, it has been shown that their exist nodes along the path at which no power is received by the vehicle, because the power received by the vehicle is a standing wave. In conceptualizing the interaction between the spiral resonators, modeling the unique interactions between each pair of loops comprising the system is important. In other words, it is important to keep an identity to each loop, and not to aggregate each resonator into a single unit. Hence, some embodiments model each loop of each spiral resonator as a unit. This method for modeling the spiral resonator enables the current density to vary between loops.

Another motivation for some embodiments of the invention is the inability of prior art circuit models to characterize the following finding. The resonant frequency of a double layer spiral resonator, with a via connecting its inner or outer leads (not both), is half the resonant frequency of the same double layer spiral resonator without the via. The circuit model for a double layer spiral resonator without the via should be modified to accurately model a double layer spiral resonator with a via.

Specifically, the physical connection of the via between the two spiral resonators is modeled by a wire connection in the circuit model of the two points to which the via connects. Existing models aggregate the double layer spiral resonator into a single unit, the tank circuit, which does not correlate to different geometries on the spiral resonators. Thus a better model is needed.

Requirements of Circuit Model

According to some embodiments of the invention, the model of the circuit needs to reflect that the spiral resonator comprises one or multiple repeating structures, e.g., loops. Although the spiral resonator includes the repeating structure, the geometry of the structure varies. The model needs to reflect this variation of the repeating pattern in a spiral resonator. Therefore, in some embodiments, the model accommodates variations in the current density between locations throughout the spiral resonator. The model needs to show the variation in the repeating structure, i.e., the value of the circuit parameters can vary from loop to loop. Also, the model should be suitable to be used for the analysis of the spiral resonator with reduced computational complexity and memory.

Method for Generating Circuit Model

Figure 2:
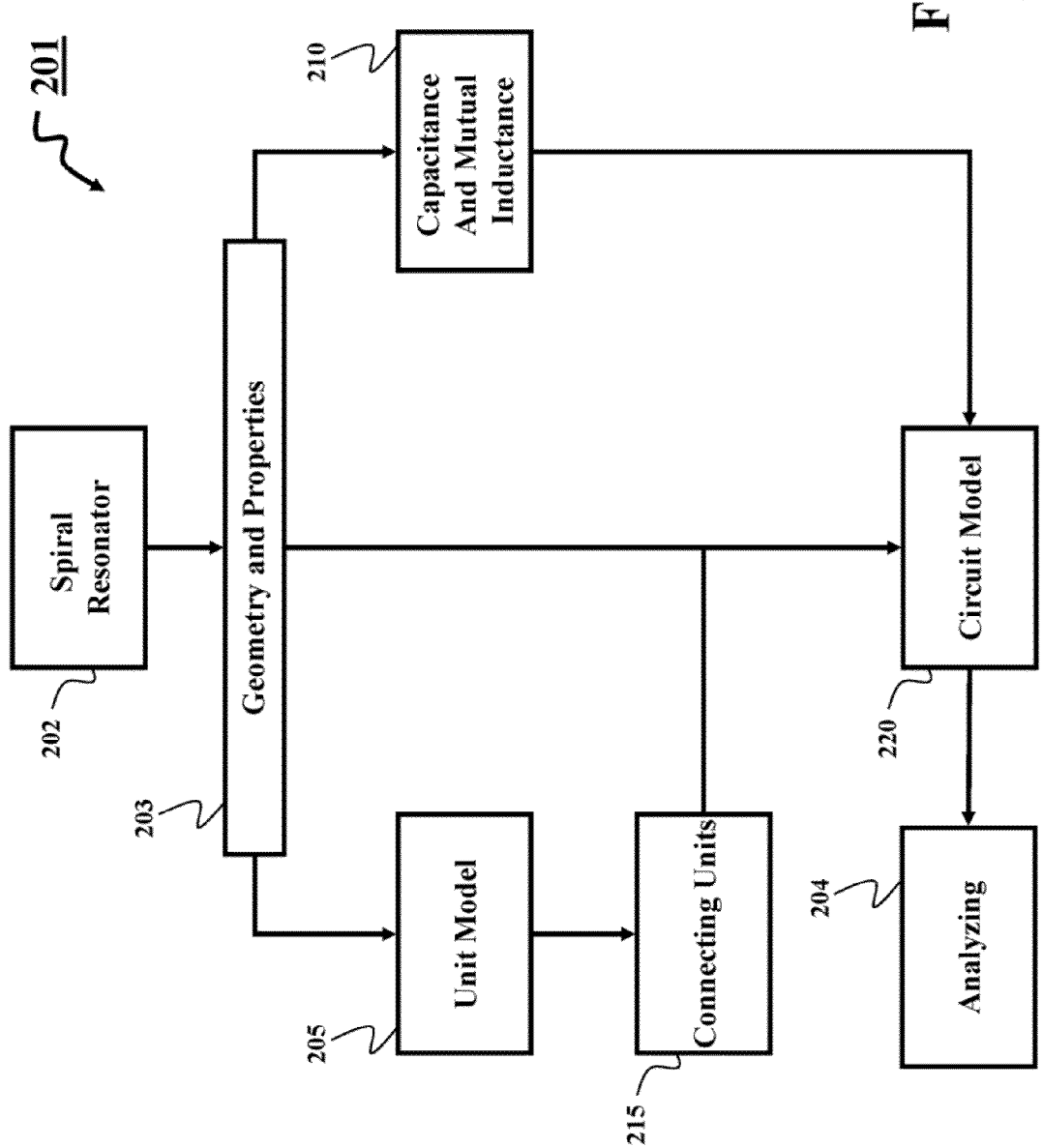
FIG. 2 is a block diagram of a method for developing a circuit model of a spiral resonator according to some embodiments of the invention.

FIG. 2 shows a block diagram of a method 200 for developing the circuit model of spiral resonators according to some embodiments of the invention. Geometric and/or material properties 203 of the spiral resonator 202 are inputs to the method. The method can be implemented using a processor 201.

In step 205 the input data are used to model each loop of the spiral resonator as a series combination of at least a resistor and an inductor, referred herein as a unit. In step 210, the input data are used to analyze the system for capacitive and inductive coupling between loops. The values of capacitance and mutual inductance are determined.

Next, the input data are used to model 215 electrical connection of the loops using, e.g., an ideal wire with no resistance. In step 220, capacitors are connected between the units for which the capacitive coupling is significant as determined in the step 210, thus forming a model of the circuit model. In some embodiments, the mutual inductance between units is determined, but not shown in the circuit model because its introduction does not result in additional current pathways. The circuit model 220 can be used to analyze 204 the electromagnetic behavior that results when the spiral resonator is connected to another electrical system, such as a voltage source.

Figure 3A:
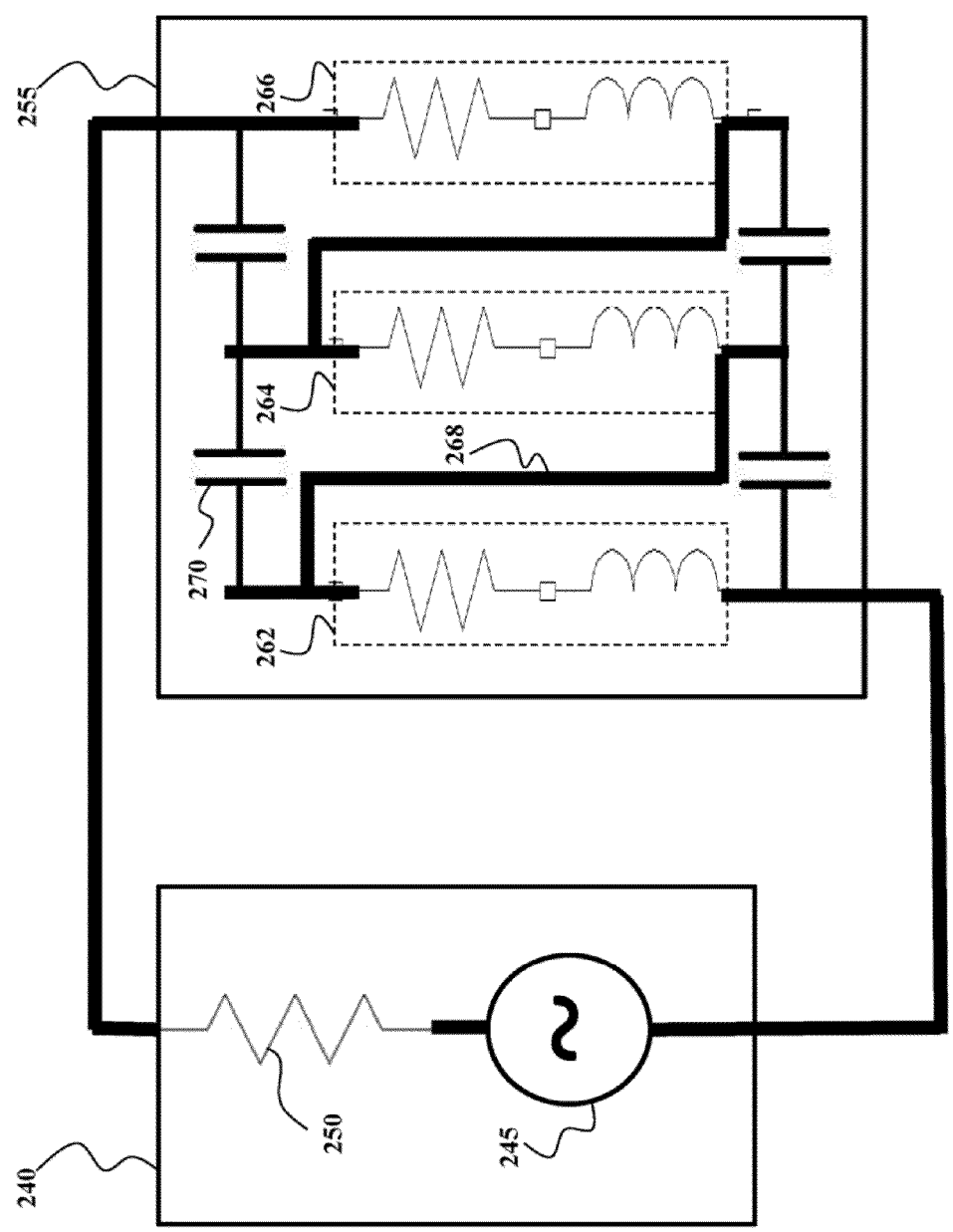
FIGS. 3A-B are schematics of examples of simulation of an operation of the spiral resonator according to some embodiments of the invention.

FIG. 3A is an example of a simulation of an operation of a three loop single layer spiral resonator with a model of a circuit 255 connected at its leads to a circuit model of a linear voltage source 240. Specifically, the circuit model 240 is connected to the circuit model 255 of the spiral resonator at the locations in the models that correspond to the locations of the physical connections of the source and the spiral resonator. In this example, the circuit model of a linear voltage source is the series combination of an ideal voltage source 245 and a resistor 250.

The model of the circuit 255 models 205 a set of loops of the spiral resonator with a set of units 262, 264, 266, each unit includes a resistor and an inductor and represents one loop of the spiral resonator. The values of the resistor and the inductor of each unit are determined based on properties 203 of a corresponding loop. The electrical connection of the loops is modeled 215 by electrically connecting 268 the units in a corresponding order. The capacitive coupling in the spiral resonator is model by connecting neighboring units with at least one capacitor 270 having a value determined 210 based on a capacitive coupling between two corresponding neighboring loops. The inductive coupling in the spiral resonator is modeled 210 based on inductive coupling between pairs of loops.

An operation of the spiral resonator can be simulated with the model of the circuit. For example, the circuit models can be used to determine the resonant frequency of the spiral resonator. Also, the circuit models determined using the method 200 can also be used to analyze the electromagnetic behavior that results when the spiral resonator is wirelessly excited, such as through magnetic induction.

Figure 3B:
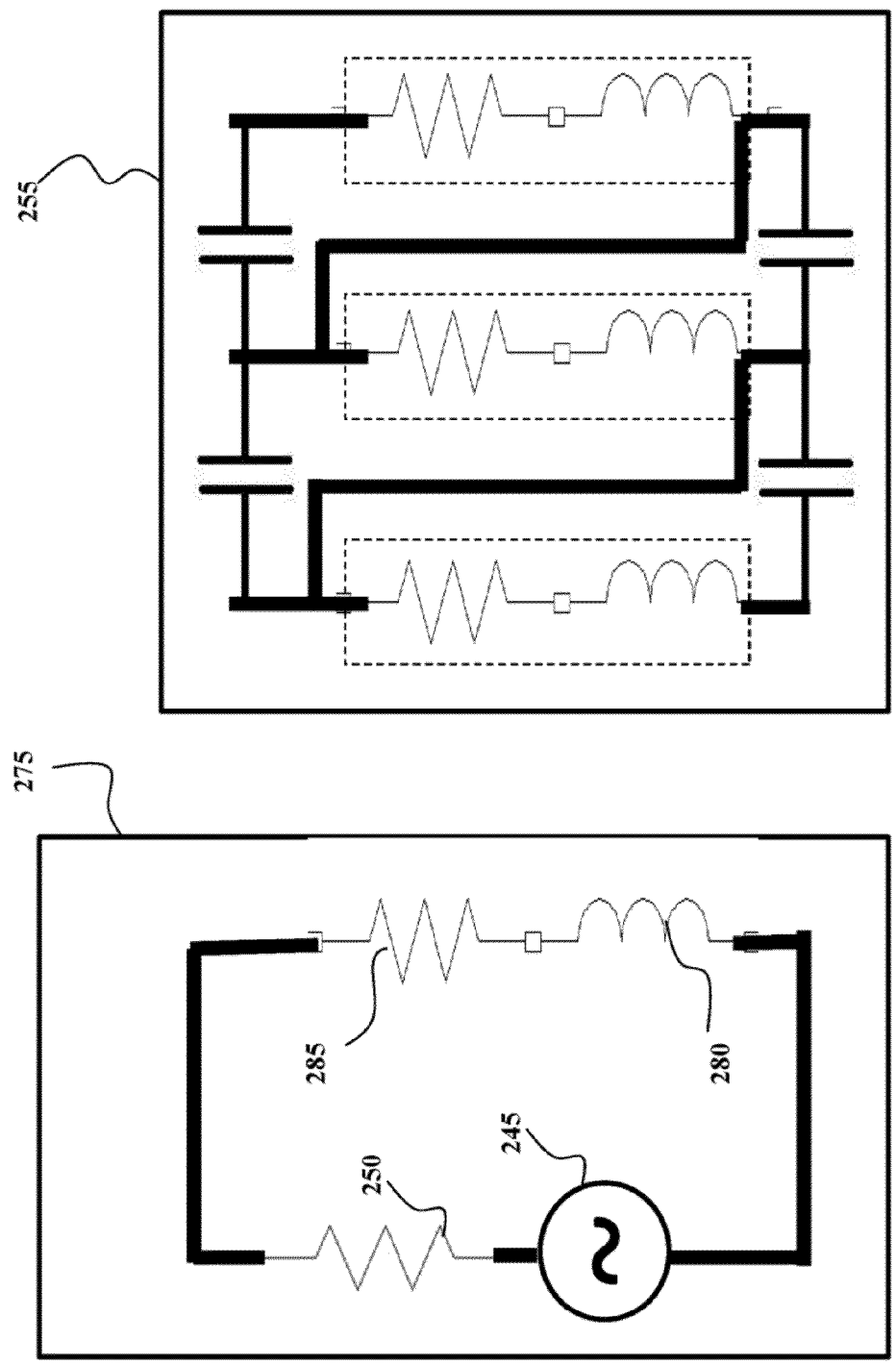

FIG. 3B is an example of a circuit model for a three loop single layer spiral resonator, 255, excited by a powered loop antenna 275 through the magnetic induction. This excitation through magnetic induction may be modeled in a circuit model as mutual inductance between the loop of the loop antenna and each loop of the spiral resonator. Thus, to analyze this circuit model, the mutual inductance between the antenna and each loop of the spiral resonator is calculated. The powered loop antenna circuit model 275 can include the linear voltage source mode, 245 with the resistor 250, and a model of the conductor forming the loop antenna. The loop antenna may be modeled as an inductor in series with a resistor 280 and 285 respectively. This circuit model may be used to determine the resonant frequency of the spiral resonator.

Figure 4A:
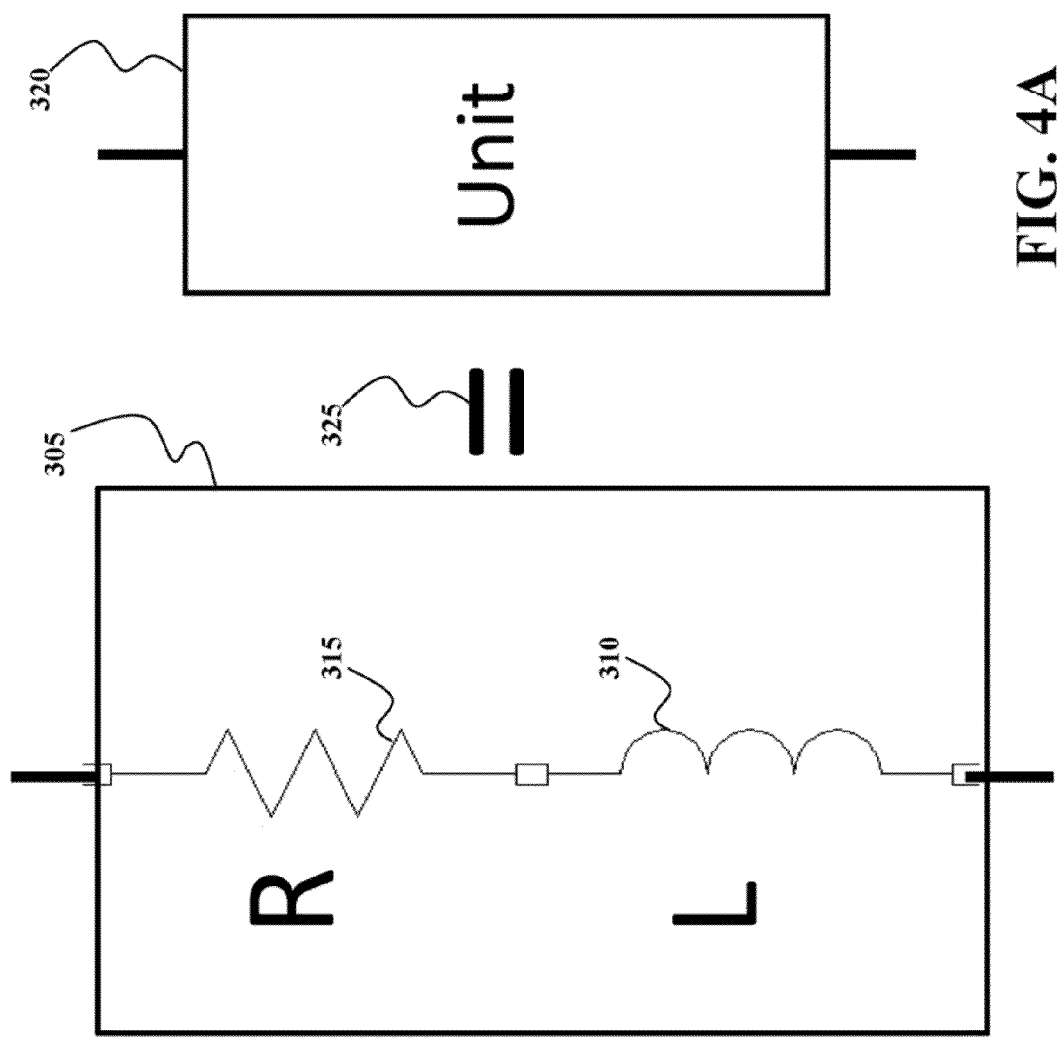
FIG. 4A is a schematic of a portion of the circuit model for each loop of the spiral resonator according to some embodiments of the invention.

FIG. 4A shows a schematic of a portion 305 of the circuit model for each loop of the spiral resonator. This portion includes two circuit components, an inductor (L), 310 and a resistor (R) 315. The value of each circuit component, R and L, depend on the geometry and material properties of the respective loop, as described below. The portion 305 is modeled 325 as the unit 320. After the loops are modeled as units, the units can be connected in an order that reflects the physical connectivity of the loops in the spiral resonator.

Figure 4B:
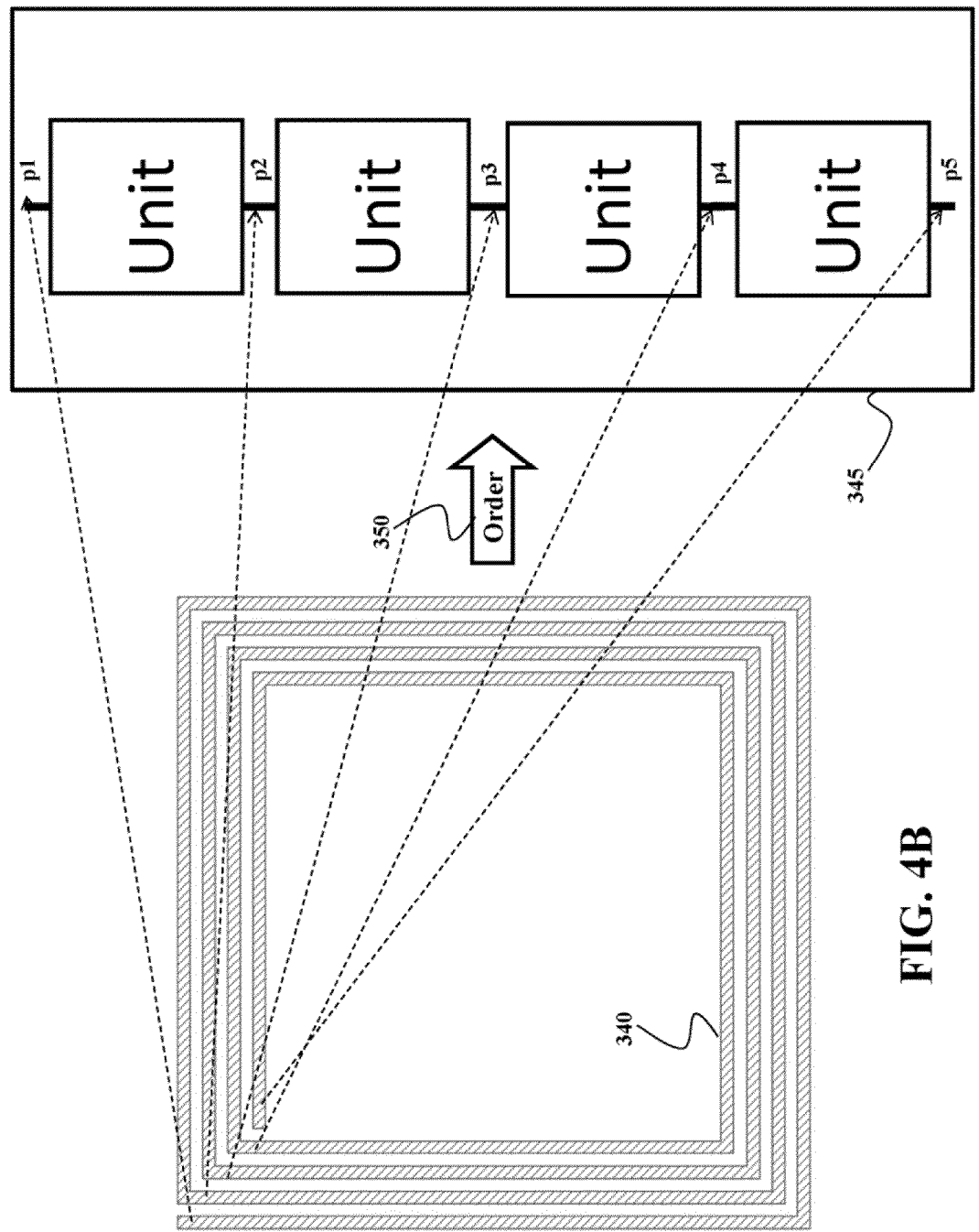
FIGS. 4B-C are schematics of ordering units corresponding to the loops of the spiral resonator according to some embodiments of the invention.

FIG. 4B shows a schematic of ordering 350 the units 345 corresponding to the loops of a four loop single layer spiral resonator, 340. The start and the end of each loop are mapped to unique positions p1, p2, p3, p4 and p5 in the circuit model of the ordered loops 345. Some embodiments do not consider relative locations of the units in the circuit model. According to those embodiments, the relative locations have no physical significance.

Figure 4C:
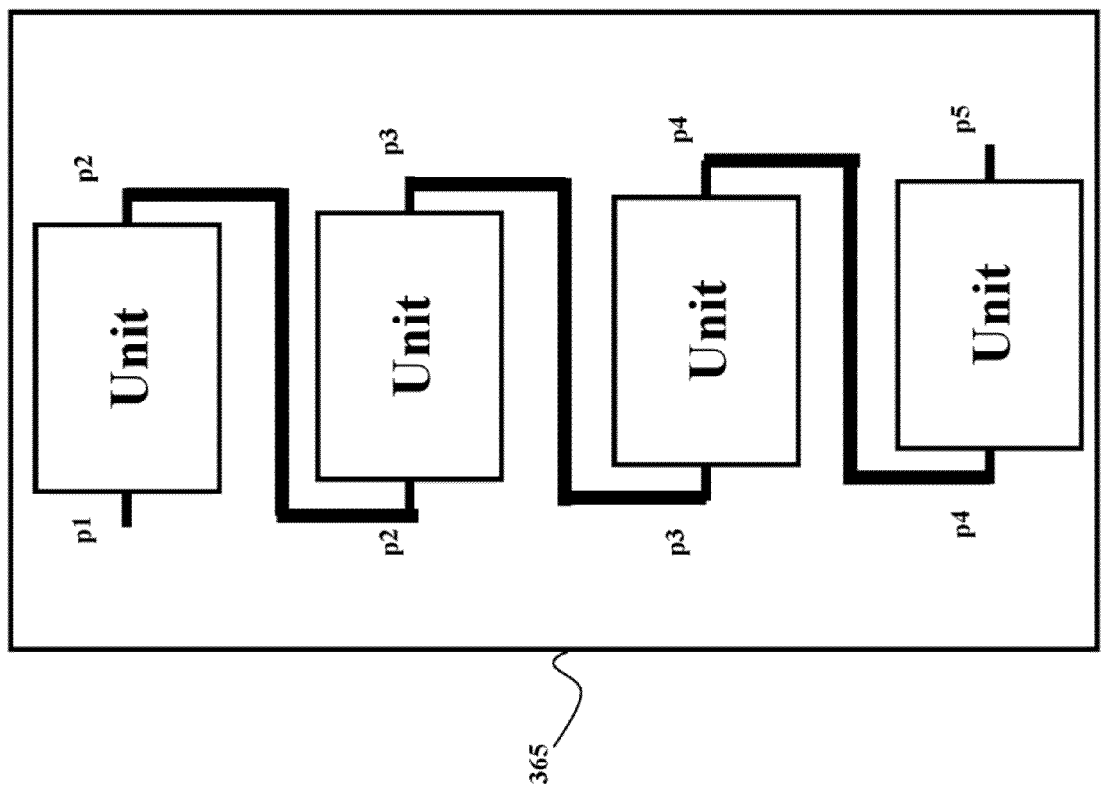

Thus, the circuit model 365 in FIG. 4C is an equivalent model of the ordered units 345. The positions of the start and end of each loop are correlated with the positions in the circuit model using the symbols p1, p2, p3, p4 and p5. There are some positions that have the same position name such as p2 because these positions are identical in terms of the electromagnetic properties of that position.

Next, the method 200 evaluates the capacitance and mutual inductance between the loops of the spiral resonator. If a loop antenna is used to excite the spiral resonator through magnetic induction, then the method also can evaluate the mutual inductance between the loop antenna and each loop of the spiral resonator. In the decisions of which capacitive coupling and inductive coupling is significant to the behavior of the spiral resonator, the frequency or bandwidth of frequencies of excitation are taken into account. However, some embodiments model only the capacitance between adjacent loops and the mutual inductance between all loops, as described below.

Figure 4D:
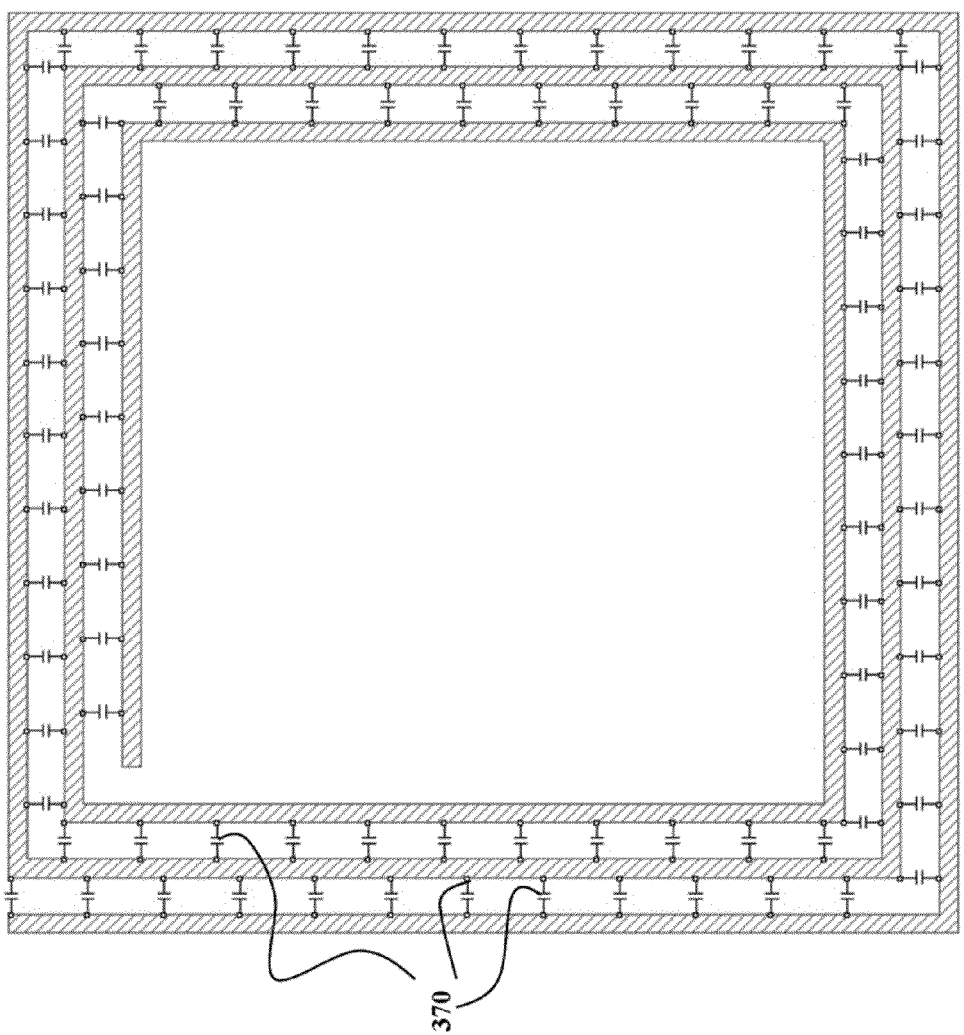
FIG. 4D is an illustration of distributed nature of capacitance between adjacent loops of the spiral resonator.

FIG. 4D shows the distributed nature of the capacitance 370 between adjacent loops of a three loop spiral. In some embodiments, the circuit model is modified by adding the capacitance and mutual inductance to at least some of the ordered units. The distributed nature of the capacitance can be modeled by using capacitors, each connecting the proximate positions of the units.

Figure 4E:
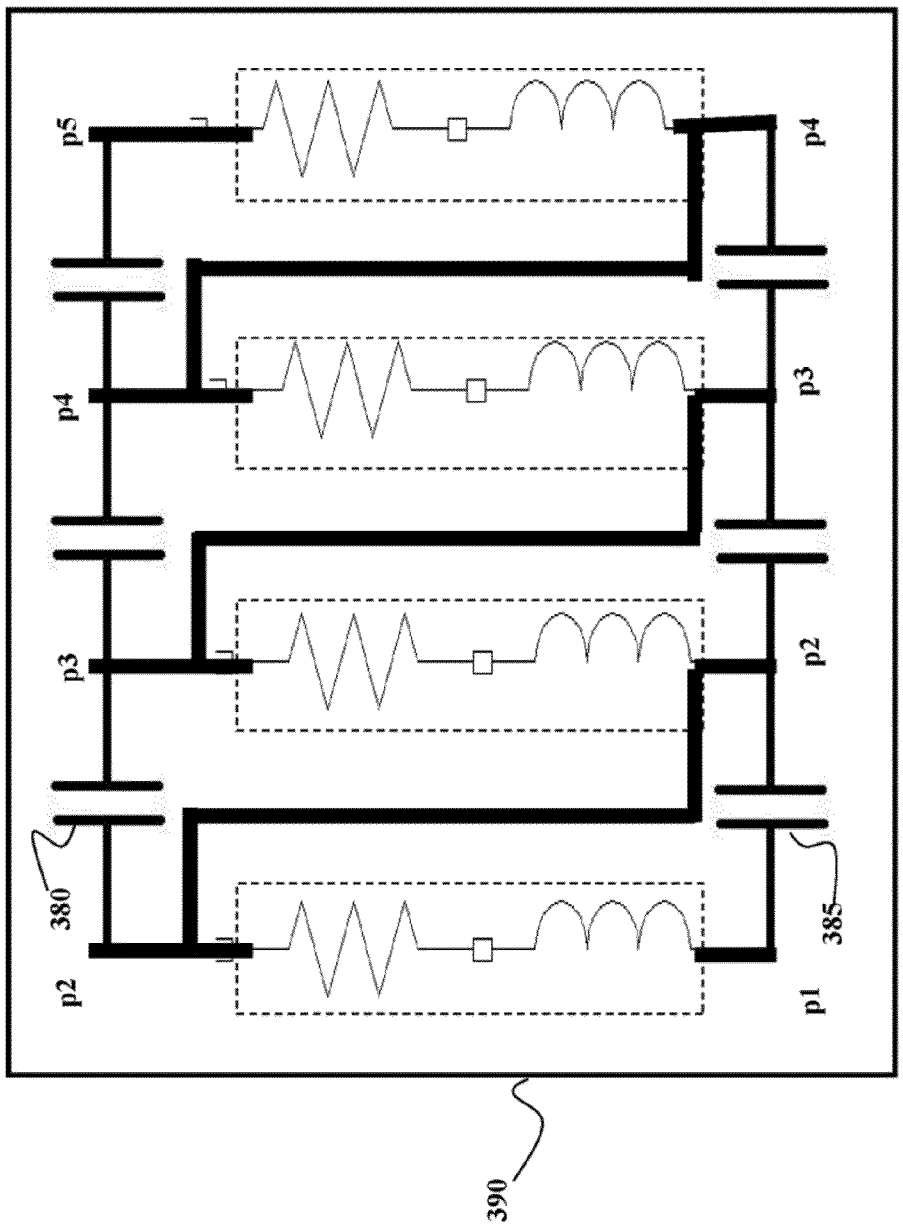
FIG. 4E is an example of the circuit model according to some embodiments of the invention.

FIG. 4E shows the circuit model 390 for the four loop single layer spiral resonator 340. In this model only the capacitance between adjacent loops is modeled. The distributed nature of the capacitance is modeled using two capacitors, e.g., capacitors 380 and 385, each connecting the positions of the units that are proximate, e.g., closest, in the physical system. Each capacitor can be given, e.g., half the capacitance of the total capacitance between the two loops. The mutual inductance can be modeled between all loops based on inductive coupling between pairs of loops, because the inductors are coupled.

Calculating Values of Component of Circuit Model

Figure 5:
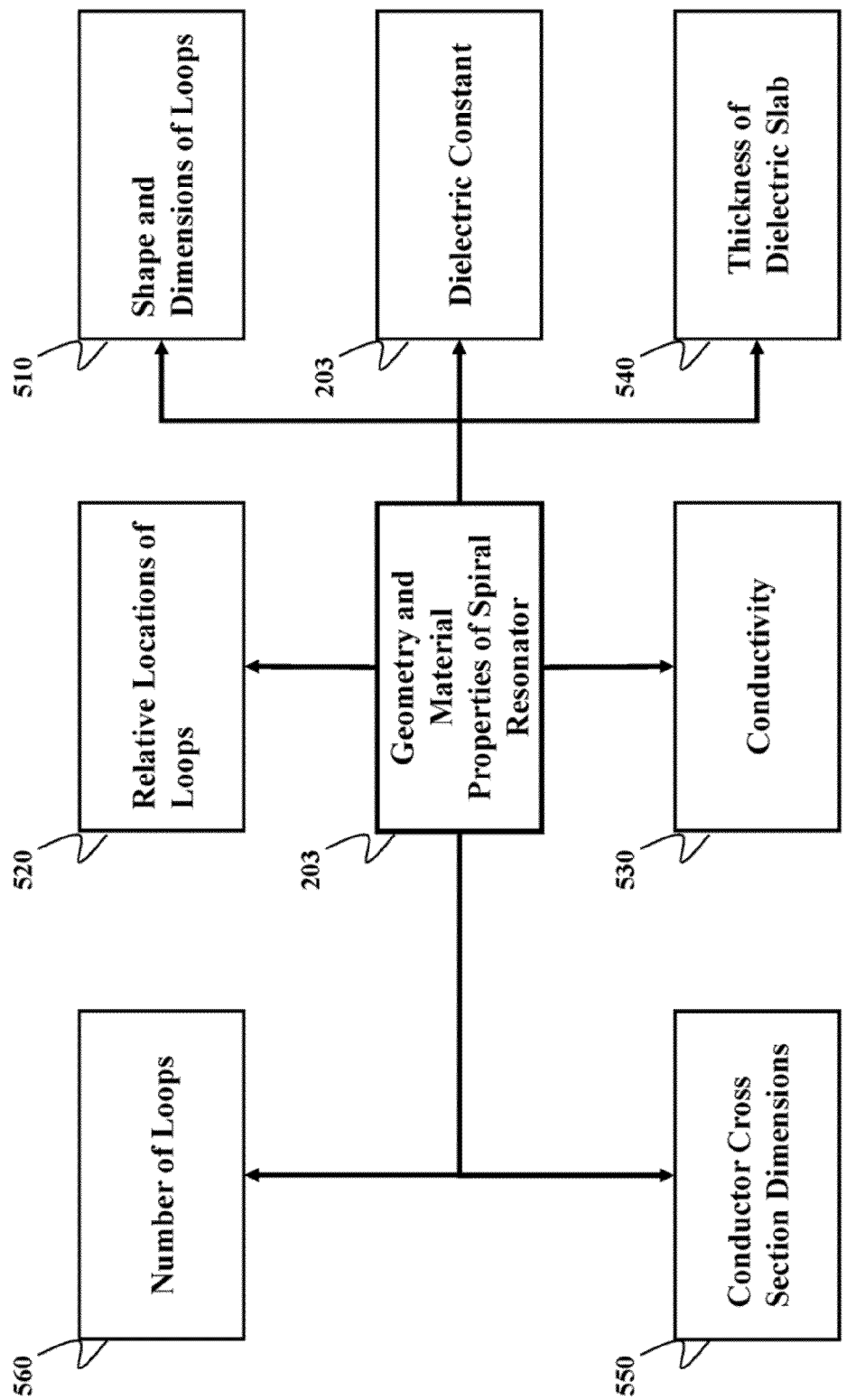
FIG. 5 is an example of information used by various embodiments to generate the circuit model.

FIG. 5 shows an example of information regarding geometry and material properties of the spiral resonator that is used by various embodiments to generate the circuit model. The geometry can include the dimensions of the spiral(s) 510, a number of loops 560, and the relative locations of the loops 520. Additionally, some embodiments use conductivity 530 of the conductor material composing each spiral resonator, and of the conductor of cross section dimensions 550.

The dimensions of the spiral resonator can be defined by the general shape (such as Archimedes' or square), the gauge or width of the conductor forming the spiral, the number of loops, and the pitch or spacing between the loops. Sometimes the spiral(s) of the spiral resonator is placed on a dielectric substrate, such as a printed circuit board (PCB). In this case, the dielectric constant and thickness of the substrate 540 can be utilized. In addition, a ferromagnetic core is sometimes arranged in the center region of the spiral(s) composing the spiral resonator. In this case, the permeability and dimensions of the ferromagnetic core are also needed.

Because the circuit model according to the embodiments is based on independent loops, some embodiments conceptually disconnect the loops to calculate the parameters of the portions of the circuit model describing each loop, and the coupling between loops. Despite being disconnected, the relative locations of the loops are maintained.

Figure 6A:
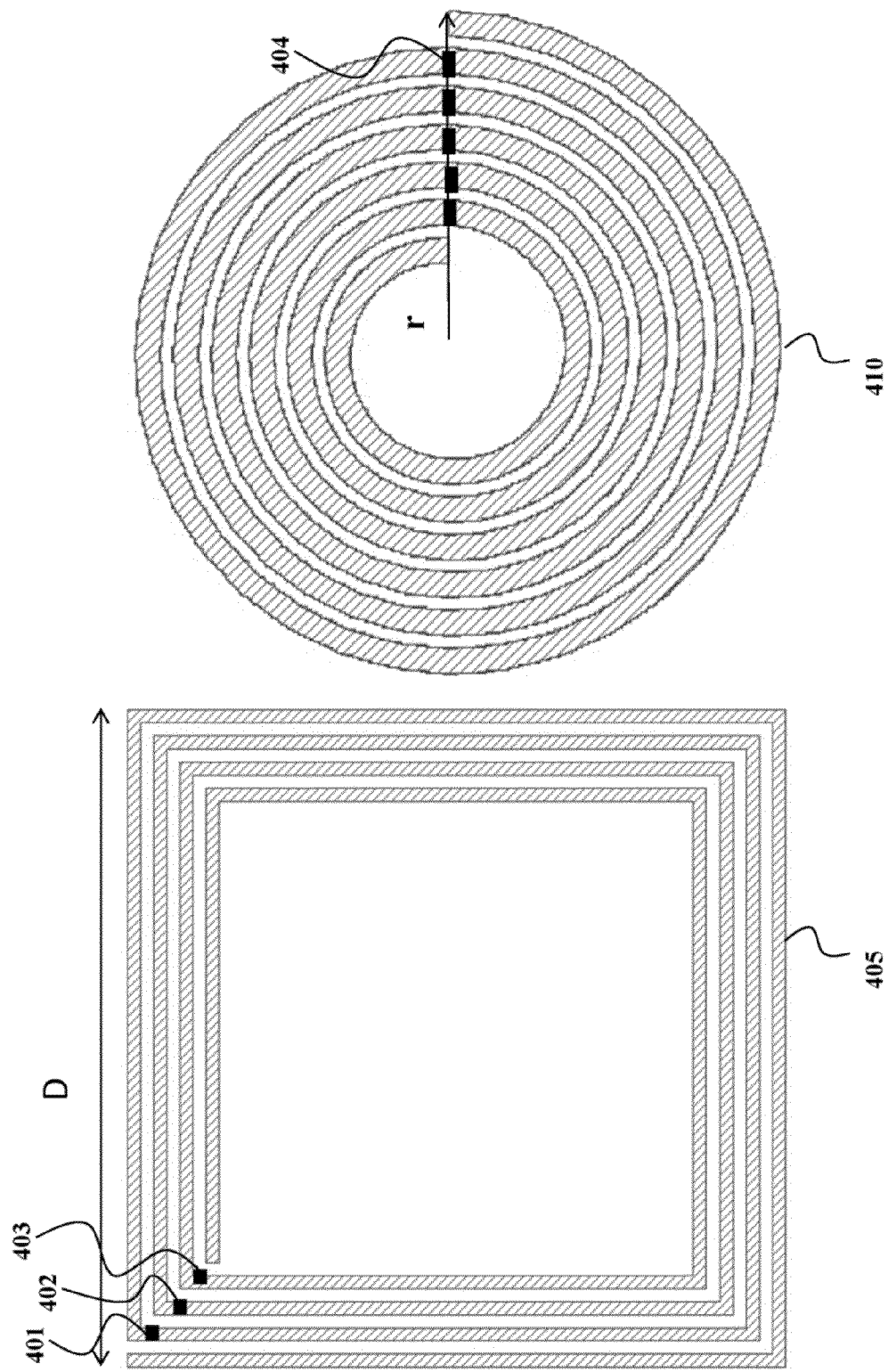
FIGS. 6A-B are schematics of approximation of the loops according to some embodiments of the invention.

FIG. 6A shows a schematic of locations at which the loops are disconnected, for example, a square spiral 405 of a length D and an Archimedes' spiral 410 of a radius r, respectively. The locations of disconnections are shown by marks, e.g., masks 401, 402, 403, 404.

Some embodiments approximate the shape of the loop to take advantage of existing analytical expressions for calculating the resistance and self-inductance of a loop, as well as the capacitance and mutual inductance between loops. In various embodiments, the approximated shape is as close as possible to the original shape of the loop.

Figure 6B:
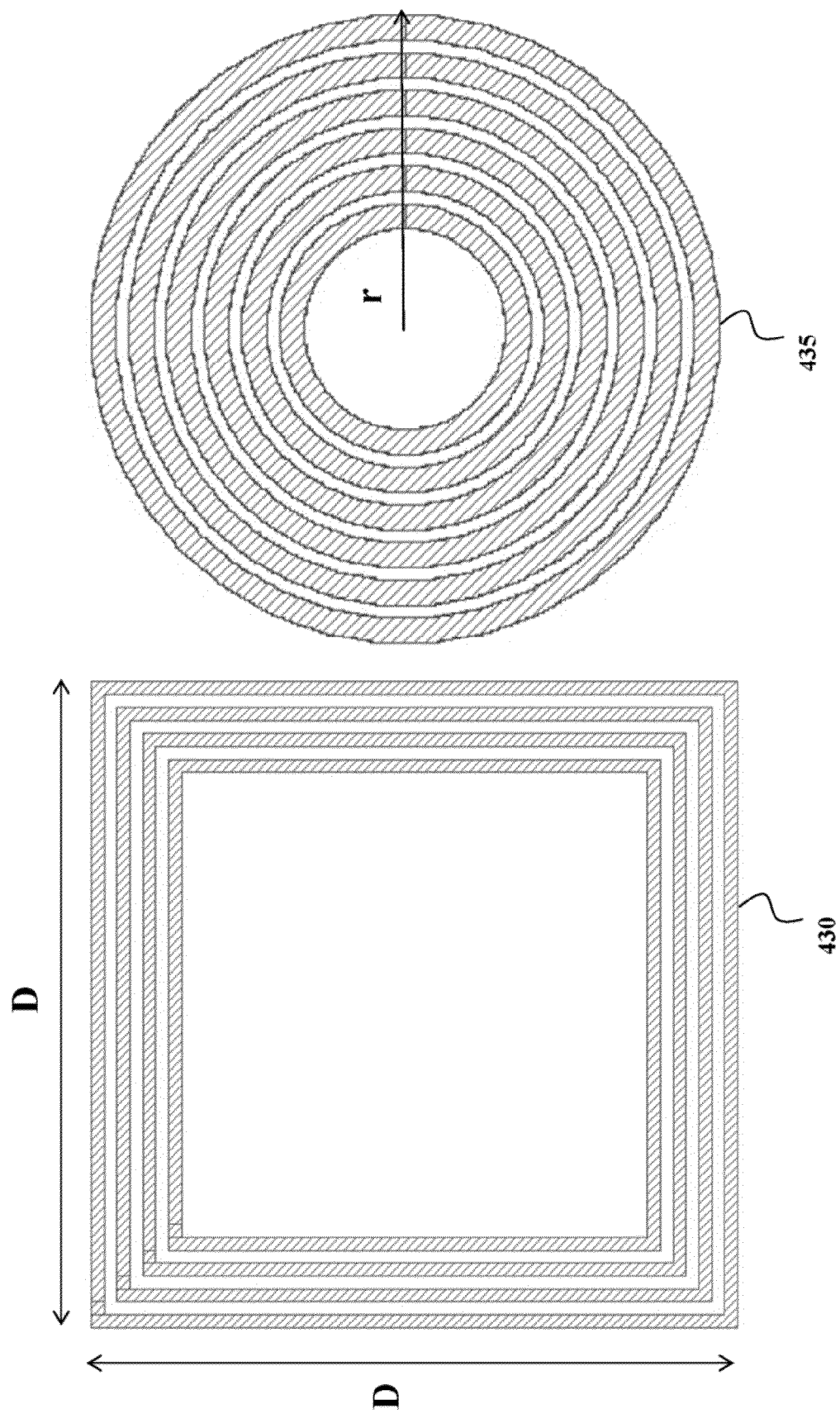

FIG. 6B shows a schematic of approximation 430 and 435 of loops of the spirals 405 and 410, respectively. The outermost dimensions of the square-like shape (D×D) and the circle-like shape (radius=r) are maintained along with the spacing between adjacent loops.

The approximated loop geometry and the relative locations of the loops can be used to model the intrinsic properties of each loop in the unit model and to model the electromagnetic interaction between each pair of loops, e.g., the capacitive and the inductive coupling.

The circuit model of a loop includes a resistor that represents the resistance of the loop. There are two types of resistance that manifest in the value of the resistance for a unit, conductive resistance ($R_{cond}$) and radiation resistance ($R_{rad}$). The equivalent resistance of the unit is the sum of the conductive and radiation resistance. Conductive resistance models the phenomenon that a current going through a wire transfers heat to the wire. Radiation resistance represents the phenomenon that accelerating charges emit energy in a form known as electromagnetic radiation. The calculation of the resistance of the unit ignores the effects of the other units (loops) on the respective unit's properties.

Based on this assumption, the contribution to conductive resistance, known as the proximity effect, can be ignored. Despite this assumption, both the conductive resistance and the radiation resistance are a function of the excitation frequency f for the spiral resonator. As a result, the parameters of the circuit model are a function of frequency. However, over a small frequency range the resistance may stay approximately constant such that one can reasonably approximate the resistance as a constant independent of the excitation frequency.

The conductive resistance can be modeled using a skin-effect model, where the current density is largest near the surface. This resistance depends on the conductivity and permeability of the conductor, $\sigma_c$ and $\mu_c$ respectively, the dimensions of the cross-section of the conductor, the length of the wire (perimeter), len, and the excitation frequency. The expression for the skin-effect resistance is simplified when the thickness of the wire or the radius of the round wire is three or more times the skin-depth $\delta$ for the conductive material at the frequencies of interest. The simplified expressions for the resistance of a rectangular cross-section wire (a trace) with width w, and for a round wire with radius r are given in Equations 110 and 120. These equations are in terms of the skin-depth, which is expression in Equation 130. The radiation resistance may be approximated as the power radiated by the loop divided by the square of the current magnitude in the loop. This calculation assumes a uniform current through the loop and then finding the power radiated using, e.g., Poynting's Theorem, which takes into account that electric and magnetic fields are coupled.

An expression for the radiation resistance of a circular loop of diameter D, which is much less than the wavelength corresponding to the excitation frequency, is described in Equation 120.

$$R_{cond} = \frac{\text{len}}{\sigma_c \delta w}. \tag{105}$$

$$R_{cond} = \frac{\text{len}}{\sigma_c \delta 2\pi r}. \tag{110}$$

$$\delta = \frac{1}{\sqrt{\pi f \mu_c \sigma_c}}. \tag{115}$$

$$R_{rad} = 2.38 \cdot 10^{-30} \cdot (fD)^4. \tag{120}$$

The self-inductance (inductance) of the unit models the energy requirement for establishing a current in the loop. The energy used to establish the current resides in the magnetic fields. The self-inductance can be approximated as a ratio of the magnetic flux through the inner boundary of the loop due to a uniform current filament along the centerline of the loop divided by the magnitude of the assumed current. This is an approximation since, in reality, the current is distributed throughout the cross section of the conductor composing the loop and is generally greatest in density near the edges of the cross-section.

Approximate expressions for the self-inductance of circular and square loops composed of round wire (with radius r) or wire of rectangular cross-section (with width w) are in Equation 125 and Equation 130 below. These expressions are accurate when r or w is much less than the dimensions of the loop. These equations are expressed in terms of width w not r. To use these equations for round wire, the embodiments replace w with 2r. In these equations D stands for the diameter of the circular loop and the size of the square loop. Lastly, $\mu_0$ is the permeability of free space: $4\pi \times 10^{-7}$ H/m.

$$L \approx \mu_0 \cdot \frac{D}{2} \cdot \left(\ln\left(\frac{8 \cdot D}{w}\right) - 2\right). \tag{125}$$

$$L \approx \frac{2\mu_0}{\pi} D\left(\sinh^{-1}\left(\frac{2D}{w}\right) - 1\right). \tag{130}$$

The approximated geometry of the loop can also be used to approximate the electromagnetic interaction between the loops (units). There are two types of interactions between the loops, capacitive coupling and inductive coupling. The capacitive coupling can be represented by a capacitor, and the inductive coupling can be represented by mutual inductance.

The total capacitance between two loops of the same spiral resonator for typical geometries can be well-approximated in using at least two methods described below. In all expressions $\in_0$ is the permittivity of free space: $8.85 \cdot 10^{-12}$ F/m. For the case of traces such as on a PCB, the method or solution due to a mathematical technique, known as conformal mapping, is very accurate. This method is for parallel traces each of width w and with a separation of s.

However, loops may be curved as in the case of the Archimedes' spiral. Despite this incompatibility, the solution for parallel traces still gives accurate results assuming the length, len, of each linear trace is the same as the average perimeter of the two traces. This analytical solution includes the effect of a dielectric slab underneath the spiral resonator such as the case of a spiral resonator printed on a PCB. Specifically, the dielectric constant, $\in_r$, and thickness of the slab, h, are taken into account. The expressions for calculating the capacitance are in Equation 135 through Equation 142. Some of the expressions are written in terms of the complete elliptical integral of the first kind K[.].

The second method is for the geometry of a spiral resonator formed by a round wire. The wire has a radius of r and the loops are separated by a distance s. An approximation can be made using the analytical formula for the capacitance between two-wires. However, this model does not include the effect of the dielectric slab on the capacitance. This expression is derived assuming the two wires are parallel; however, this may not be the case in all applications. The parallel solution may also be used as good approximation by assuming the length of each wire is the average perimeter of each loop in the pair.

The expression used to calculate the capacitance is in Equation 145.

$$C = \varepsilon_0 \varepsilon_{eff} \operatorname{len} \frac{K[k_0']}{K[k_0]} \tag{135}$$

$$\varepsilon_{eff} = 1 + (\varepsilon_r - 1)q \tag{136}$$

$$q = \frac{1}{2} \frac{K[k']K[k_0]}{K[k]K[k_0']} \tag{137}$$

$$k = \frac{\tanh\left(\frac{\pi s}{4h}\right)}{\tanh\left(\frac{\pi(2w+s)}{4h}\right)} \tag{138}$$

$$k' = \sqrt{1 - k^2} \tag{139}$$

$$k_0 = \frac{s}{2w + s}. \tag{140}$$

$$k_0' = \sqrt{1 - k_0^2}. \tag{141}$$

$$\varepsilon_{r,av} = \frac{\varepsilon_r + 1}{2} \tag{142}$$

$$C = \frac{\operatorname{len} \cdot \pi \varepsilon_r \varepsilon_0}{\ln\left[\left(\frac{s}{2r} - 1\right) + \sqrt{\left(\frac{s}{2r} - 1\right)^2 - 1}\right]}. \tag{145}$$

Another embodiment models the geometry of a two layer spiral resonator (spiral resonators may be connected with the via) separated by a dielectric, such as a PCB. In this geometry, the geometry of the spiral resonators can be generally concentric and identical. The capacitance between these nearby loops may be approximated using a parallel plate model for the cases of traces or a two-wire line model for the round wire spiral resonators.

The parallel plate model is a function of the area A of each plate (the trace area) and the separation distance S between the traces. Those models are generally inaccurate. The expression for the capacitance according to the parallel plate model and the two-wire line are in Equation 150 and 145, respectively. A more accurate analytical model uses a conformal mapping technique according to $$C = \frac{\varepsilon_0 \varepsilon_r A}{S}. \tag{150}$$

where A is area of each plate, and S is separation distance between the traces.

The mutual inductance between any pair of loops can be approximated similarly to a method for determining self-inductance of a loop. Specifically, the mutual inductance between two loops is a ratio of a magnetic flux through one of the loops due to a uniform current in the other loop divided by a magnitude of the current. The current can be assumed to be a uniform current filament along a centerline of the loop. Simple analytical models for concentric circular loops and for concentric square loops can be derived, e.g., analytically. The mutual inductance between two concentric loops of loop radius and conductor width (for traces) $r_1$ and $w_1$, and $r_2$ and $w_2$, separated by a distance h is given in Equations 155 through 158. For round wire, the diameter of the wire is substituted in for the width, w. The expression depends on the complete elliptic integrals of the first and second kind, K[ ] and E[ ], respectively.

$$M_{12} = \mu \sqrt{(r_1 - w_1) \cdot \left(r_2 - \frac{w_2}{2}\right)} \cdot \left[\left(\frac{2}{k} - k\right)K[k] - \frac{2}{k}E[k]\right]. \tag{155}$$

$$k \equiv \sqrt{\frac{4 \cdot (r_1 - w_1) \cdot \left(r_2 - \frac{w_2}{2}\right)}{h^2 + \left(r_1 + r_2 - w_1 - \frac{w_2}{2}\right)^2}}. \quad (156)$$

$$K[k] \equiv \int_0^{\pi/2} \frac{d\varphi}{\sqrt{1 - k^2 \sin^2(\varphi)}}. \quad (157)$$

$$E[k] \equiv \int_0^{\pi/2} \sqrt{1 - k^2 \sin^2(\varphi)} \, d\varphi. \quad (158)$$

With the resistance and inductance of each loop, and the capacitive and magnetic coupling parameters between the loops, the circuit model can be analyzed.

Example of a Four Loop Single Layer Square Spiral Resonator

FIG. 7A shows an example of geometry and material properties of a four loop single layer square spiral resonator. Using this information the loops of the spiral resonator are disconnected from each other and idealized into square loops. Then, the resistance and inductance of each loop is calculated in order to determine the model of the unit of each loop. The resistance is calculated at each frequency for which the circuit is analyzed. However, over a small frequency range the resistance does not change significantly and in some embodiments assumed constant. In this example, the radiation resistance is ignored, i.e., only the conductive resistance is calculated. These units are then connected in the order that corresponds to their respective loop connections.

The capacitive coupling between the traces is calculated using the conformal mapping technique. Only the capacitance between adjacent traces is considered. This total capacitance between adjacent loops is partitioned into two equal capacitors. One of the capacitors is used to connect the beginning of the two loops, and the other is used to connect the ends of the two loops. The mutual inductance between all the loops is also determined. The resulting circuit model is shown in FIG. 4C.

FIG. 7B describes geometry of an exemplar loop antenna exciting the spiral resonator through magnetic induction in order to measure its resonant frequency. The mutual inductance between each loop of the spiral resonator and that of the loop antenna is calculated in the same manner as the mutual inductance between the loops of the same spiral resonator. The loop antenna, in one example, is placed 10 mm above the spiral resonator with a concentric axis. The loop antenna can be modeled as an inductor and a resistor (a unit) powered by an ideal voltage source.

The circuit model of the system is analyzed to determine an input impedance, $Z_{in}$, at the voltage source, over a frequency range. The impedance data are then used to calculate the corresponding magnitude $S_{11}$ in decibels (dB) at by the voltage source. The magnitude $S_{11}$, assuming a characteristic impedance of 50Ω, can be calculated from the input impedance $Z_{in}$ using Equation 165, $$S_{11} = 20 \cdot \log\left(\frac{Z_{in} - 50}{Z_{in} + 50}\right). \quad (165)$$

Figure 8A:
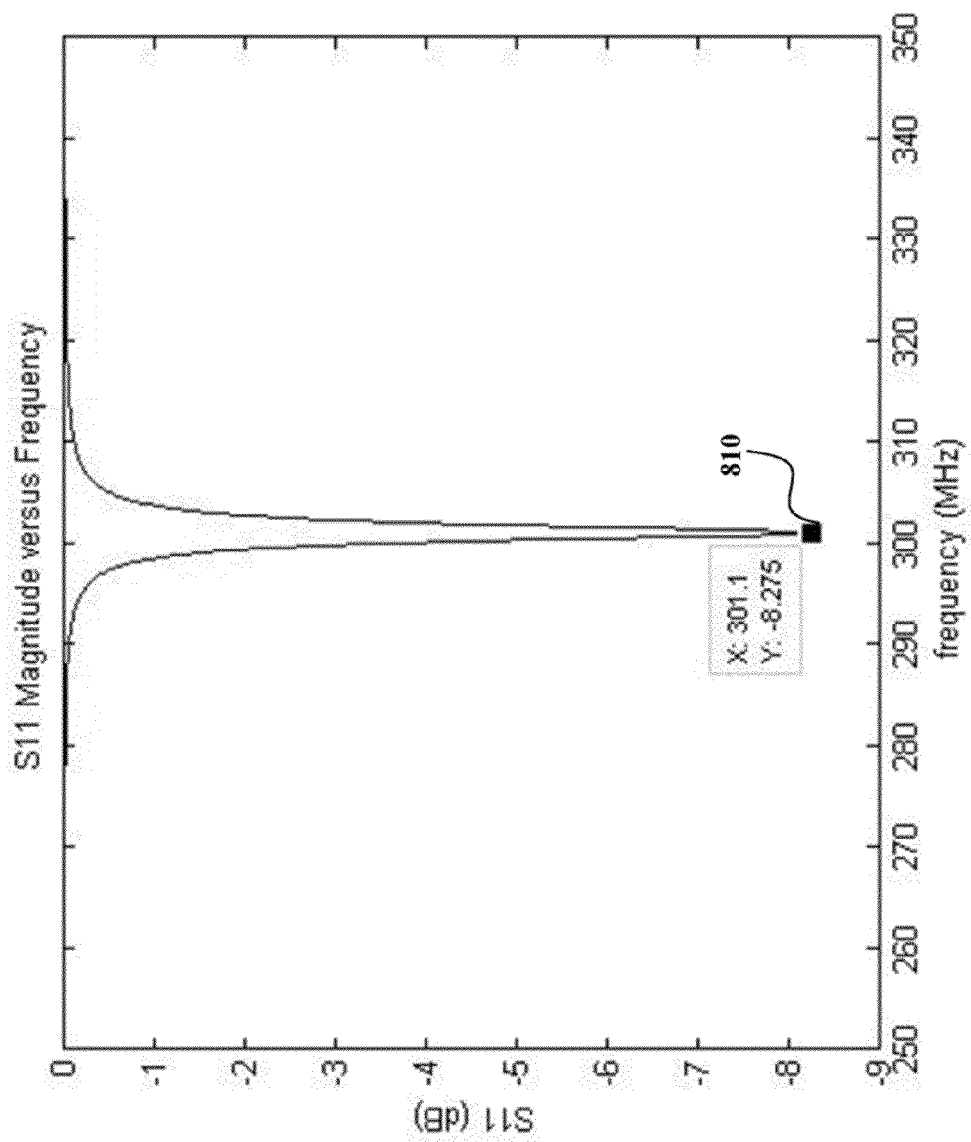
FIGS. 8A-B are graphs of a results of simulation of the system of FIGS. 7A-B.

FIG. 8A shows a graph of the $S_{11}$ data versus frequency that can be used to locate the resonant frequency. The analysis of the circuit model predicts a resonant frequency 810 of 301.1 MHz. The experimentally found resonant frequency is 207.6 MHz.

Figure 8B:
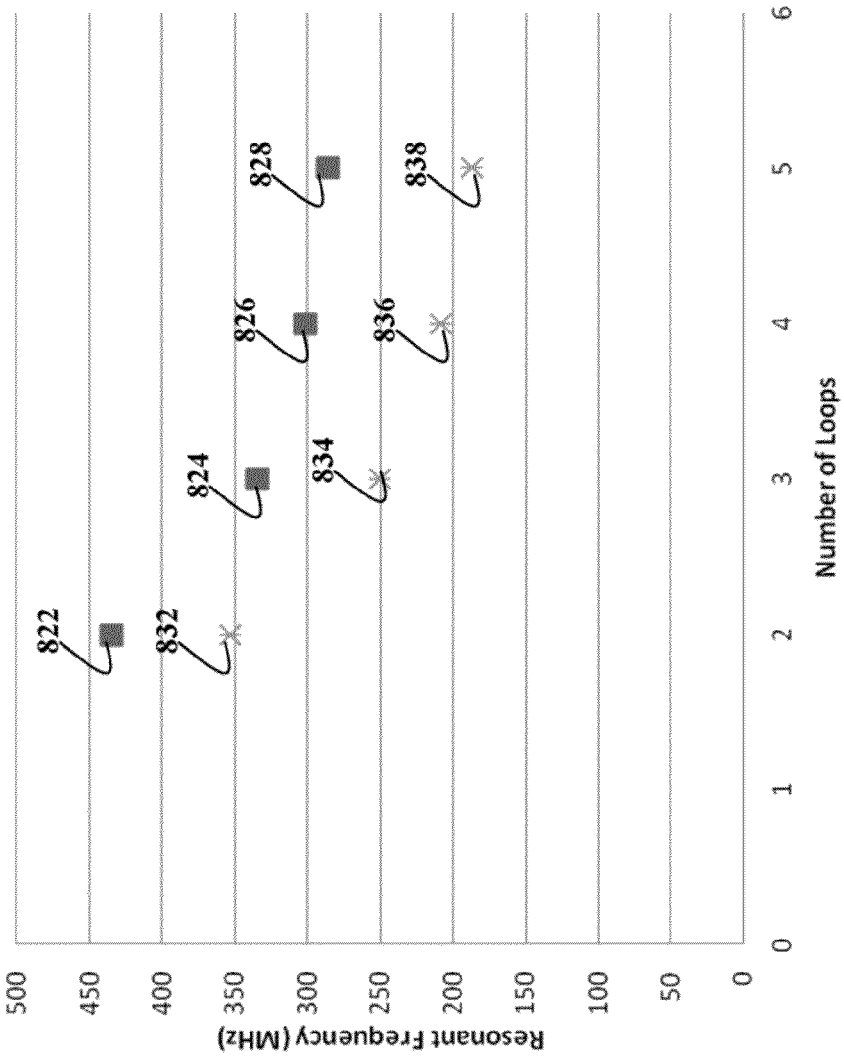

FIG. 8B compares results 822, 824, 826, and 828 for various types of resonators, with corresponding results 832, 834, 836, and 838 obtained through experimentation. Hence, the embodiment shows the general trend in the resonant frequency as a function of the number of loops and provide good approximation of the resonant frequency of a spiral.

Example of Double Layer Square Spiral Resonator with and without a Via

Figure 9B:
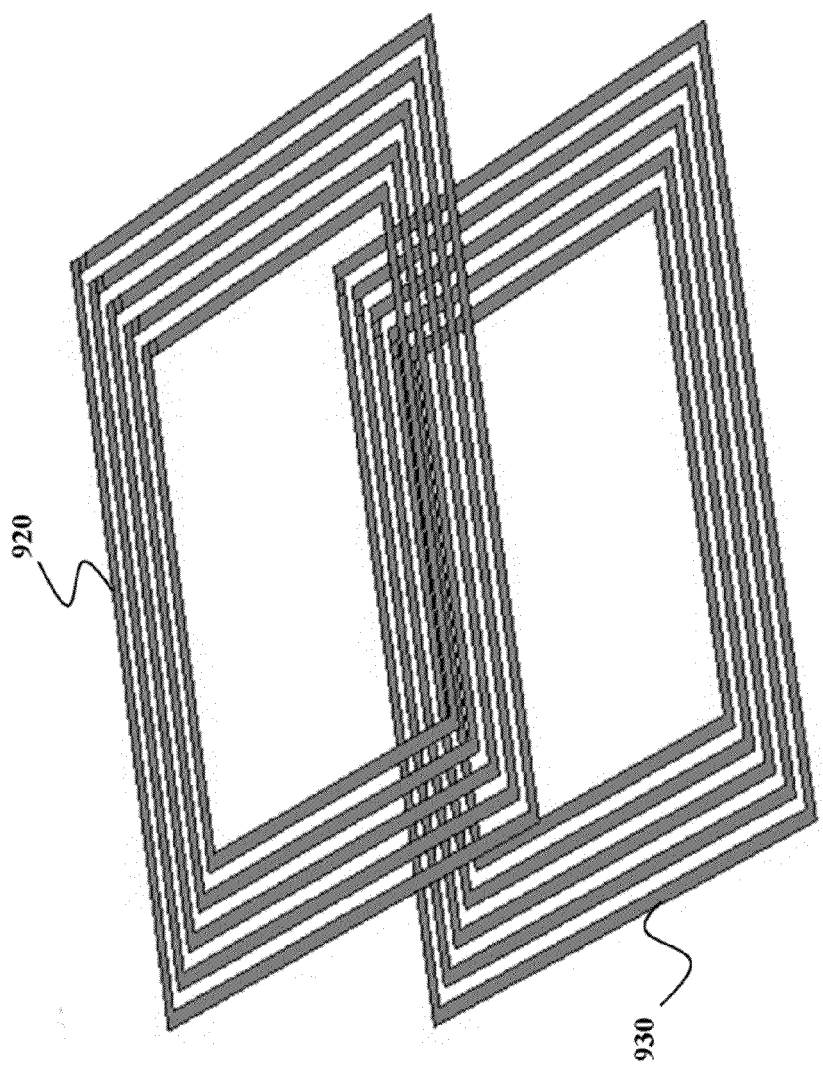

FIG. 9A shows a table 910 describing geometry and parameters of a five loop double layer square spiral resonator analyzed using some embodiments of the invention. In this example, the analysis is performed with and without the via connecting inner leads of the spiral. Using the information of the Table 910, the loops of the spiral resonator are disconnected from each other and approximated into loops 920 and 930 having square shapes, as shown in FIG. 9B. Then, the resistance and inductance of each loop is determined to build the unit model of each loop. In some embodiments, the resistance is determined for various frequencies for which the circuit is analyzed.

Over a small range of the frequencies the resistance does not change significantly. For example, over a frequency range of 10% bandwidth around the center frequency, the resistance value changes about 5%. One embodiment assumes the resistance constant for the range. In this embodiment, the radiation resistance of the spiral resonator is ignored; only the conductive resistance is determined.

Figure 9C:
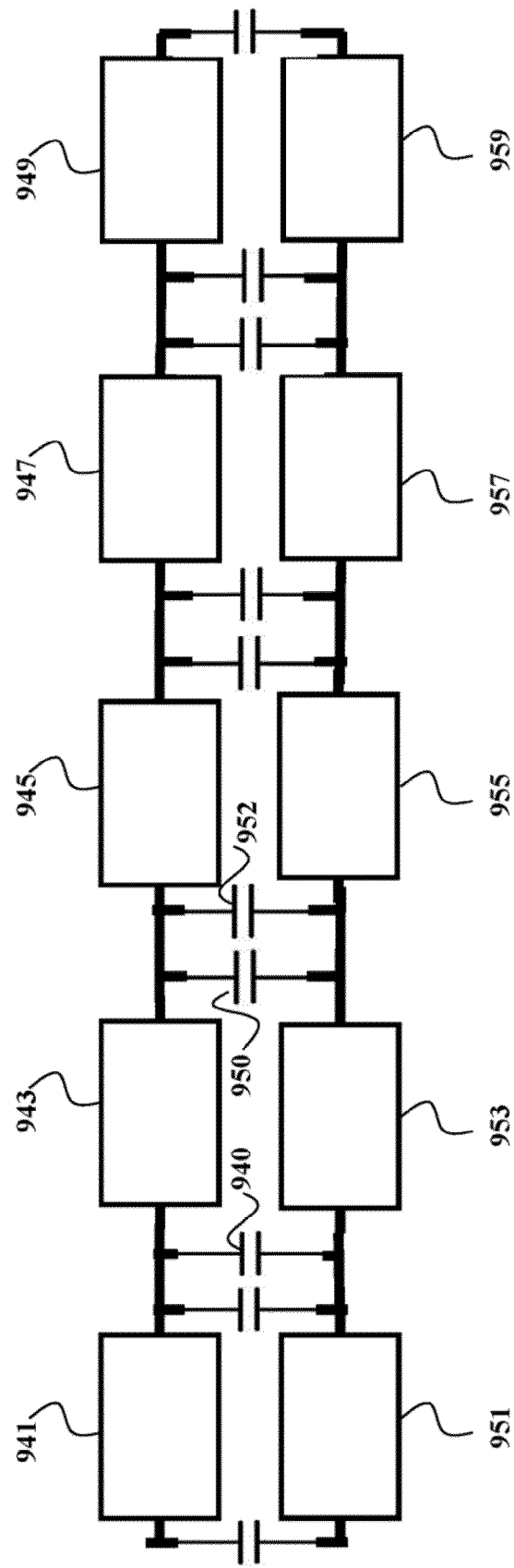
FIGS. 9C-D are schematics of connections of the units modeling the system of FIGS. 9A-B.

FIG. 9C shows connections of the units modeling the loops in the order that corresponds to the connections of the respective loops. For example, units 941, 943, 945, 947, and 949 model the loops of the spiral 920. Similarly, units 951, 953, 955, 957, and 959 model the loops of the spiral 930. As described above, each unit includes a resistor and an inductor.

The capacitive coupling between the traces can be calculated using the parallel-plate capacitor model with a correction factor found using a numerical simulation of the capacitance. In some embodiments, only the capacitance between opposing traces of spirals 920 and 930 is considered, i.e., the capacitance between loops of the same spiral resonator is ignored.

In various embodiments, the total capacitance between adjacent loops is modeled by two capacitors, e.g., of equal values. A first capacitor 940 connects the beginning of the two loops, and a second capacitor 950 connects the ends of the two loops. Except at the ends of the circuit model, there are always two capacitors next to each other, e.g., capacitors 950 and 952, as shown in the FIG. 9C.

Figure 9D:
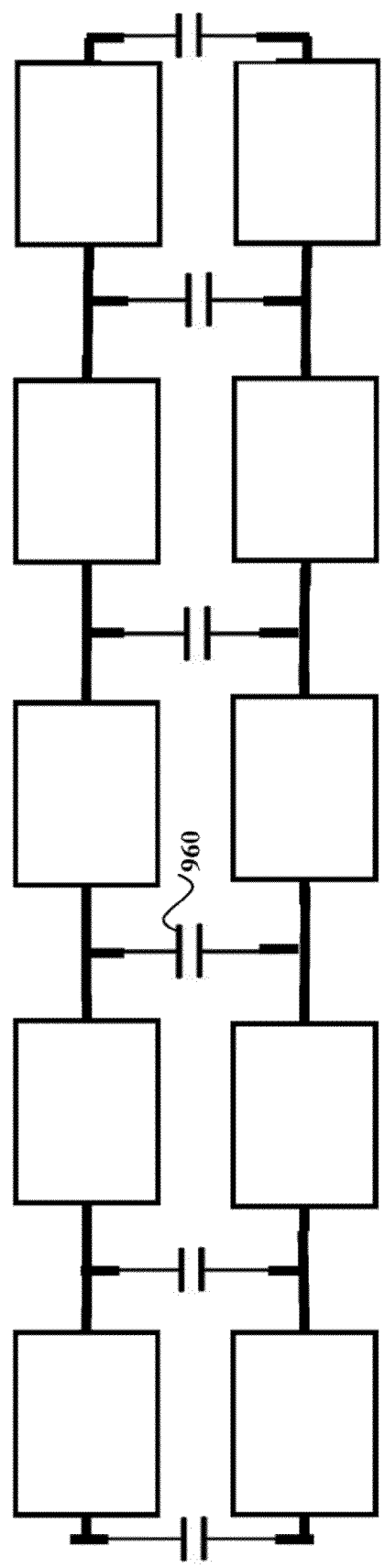

Some embodiments simplify the circuit model using the equivalent capacitance theorem for parallel capacitors to determine a capacitance of an equivalent capacitor 960. Specifically, the equivalent capacitance of two capacitors in parallel is the sum of the two capacitances. The simplified model is shown in FIG. 9D. The mutual inductance between all the loops is also determined, but not written explicitly in the model.

To measure the resonant frequency, the spiral resonator is excited by a loop antenna through magnetic induction. The mutual inductance between each loop of each spiral resonator and that of the loop antenna is calculated in the same manner as the mutual inductance between the loops of the same spiral resonator. In this example, the loop antenna is arranged 10 mm above the top spiral resonator of the double layer spiral resonator with a concentric axis. The geometry of the loop antenna is shown in FIG. 7B. The loop antenna is modeled as an inductor and a resistor (a unit) powered by an ideal voltage source.

Next, the resultant circuit model is analyzed to determine the input impedance at the voltage source over a frequency range. The impedance data are then used to calculate the corresponding magnitude $S_{11}$ in decibels (dB) at the voltage source. The magnitude $S_{11}$ can be calculated from the input impedance $Z_{in}$ using Equation 165.

Figure 10A:
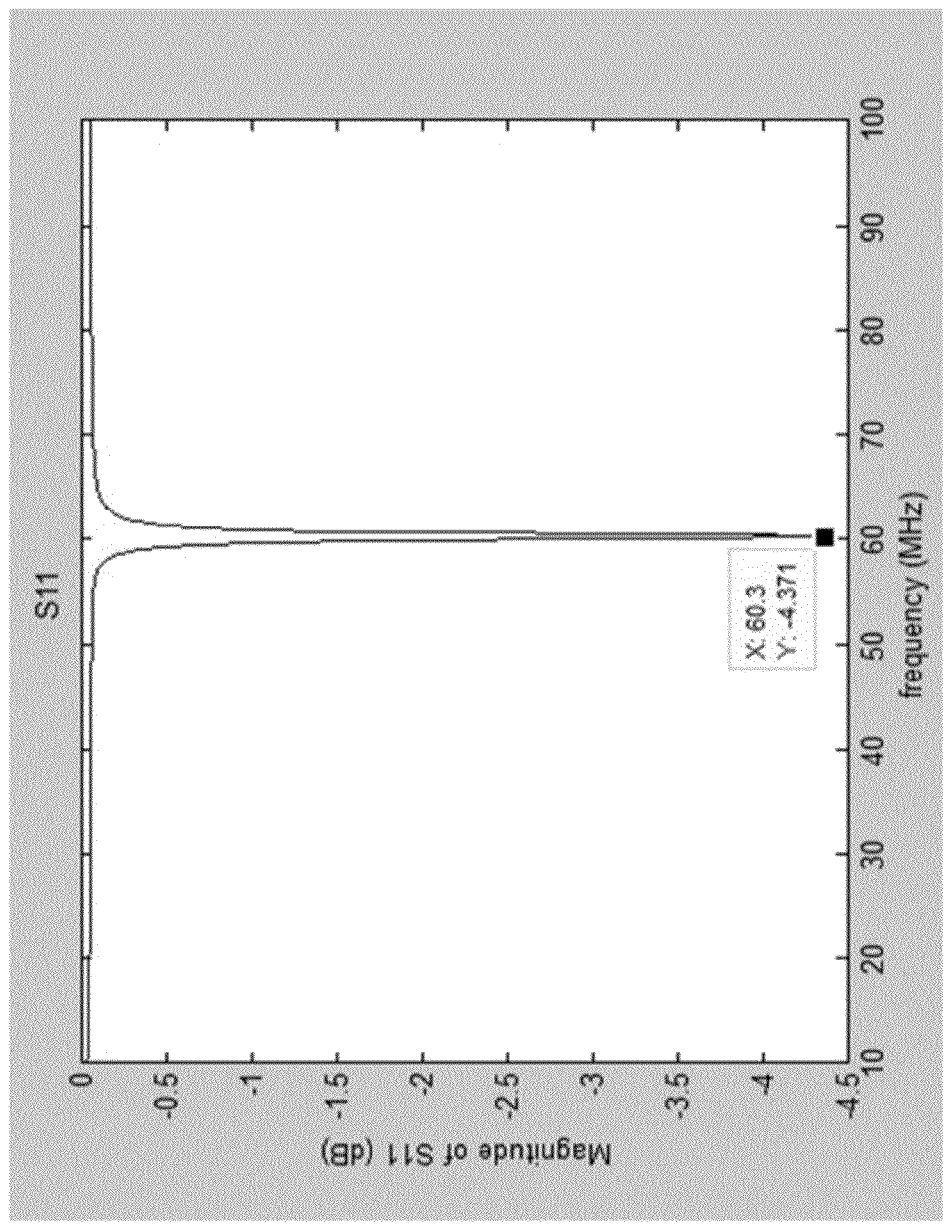
FIGS. 10A-B are graphs of a results of simulation of the system of FIGS. 9A-B.

FIG. 10A shows the magnitude $S_{11}$ as a function of frequency, which can be used to locate the resonant frequency. Embodiments determine a resonant frequency of 60.3 MHz. The experimentally found resonant frequency is 65.1 MHz.

Figure 10B:
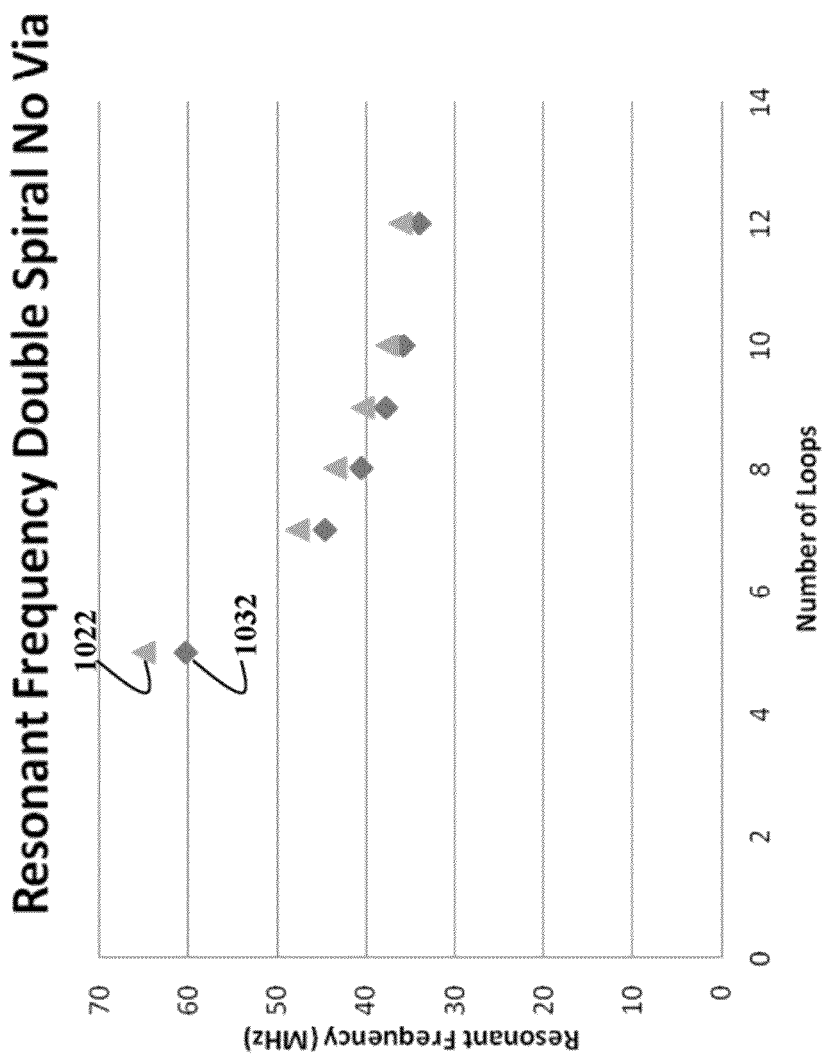

FIG. 10B compares results represented by triangles, e.g., a triangle 1022, determined for various types of resonators, with corresponding results represented by diamonds, e.g., a diamond 1032, which are obtained through experimentation. Hence, the embodiments show the general trend in the resonant frequency as a function of the number of loops and provide good approximation of the resonant frequency of a spiral.

Figure 11:
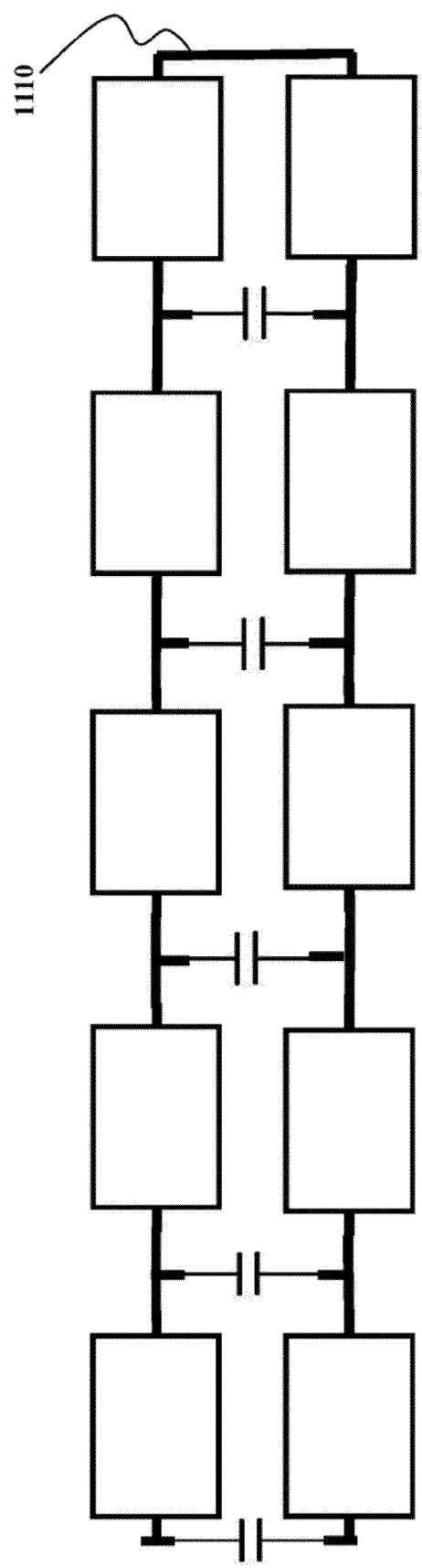
FIG. 11 is a schematic of a circuit model of a spiral double resonator having a via according to some embodiments of the invention.

FIG. 11 shows a circuit model 1100 with a set of units modeling loops of a spiral double resonator having the via connecting the inner or outer leads. In the example of FIG. 11, the via connects the inner leads and is model by an ideal wire 1110 extended between the two locations in the circuit model corresponding to the inner leads. The wire makes the capacitor connecting the inner leads effectively have an infinite capacitance.

The circuit model 1100 is analyzed to determine the input impedance at by the voltage source over a frequency range. This input impedance is then used to calculate the corresponding magnitude $S_{11\ at}$ the voltage source. The magnitude $S_{11}$ dB can be calculated from the input impedance $Z_{in}$ using Equation 165.

Figure 12A:
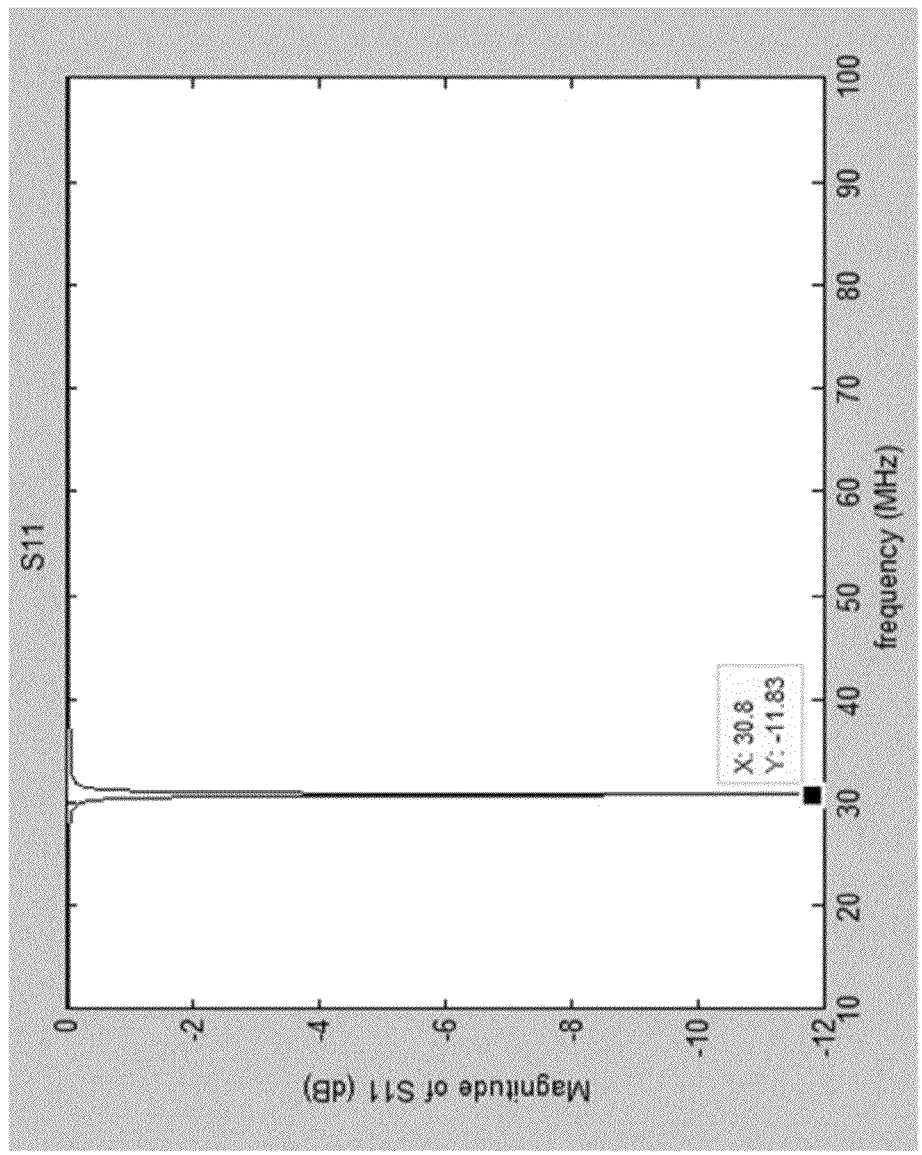
FIGS. 12A-B are graphs of a results of simulation of the system of FIG. 11.

FIG. 12A shows a plot of $S_{11}$ data as a function of frequency, which can be used to locate the resonant frequency. Embodiments determine a resonant frequency of 30.8 MHz. The experimentally resonant frequency is 31.8 MHz.

Figure 12B:
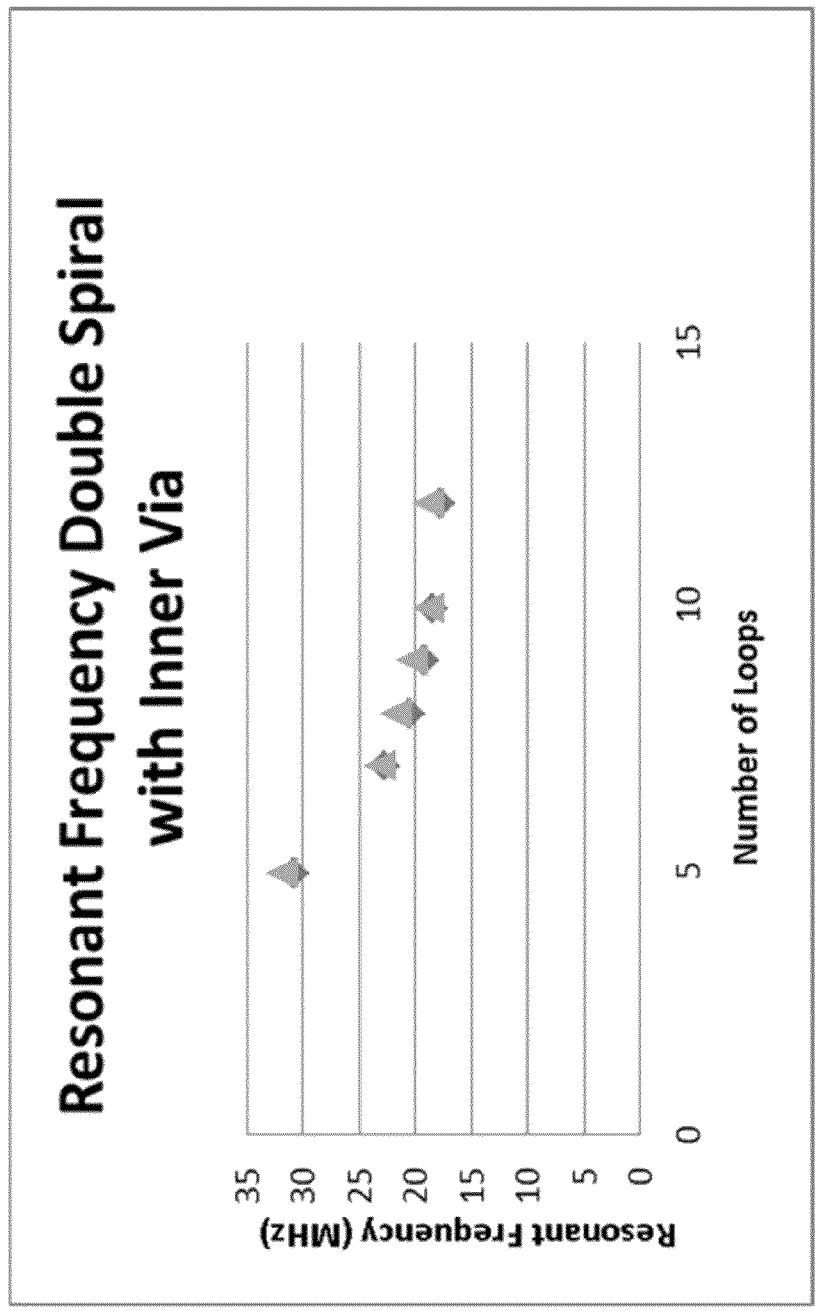

FIG. 12B compares results represented by triangles determined for various types of resonators, with corresponding results represented by diamonds, which are obtained through experimentation. Hence, the embodiments are a good approximation of the resonant frequency of the spiral structure.

The above-described embodiments of the invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, minicomputer, or a tablet computer. Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a non-transitory computer-readable medium or multiple computer readable media, e.g., a computer memory, compact discs (CD), optical discs, digital video disks (DVD), magnetic tapes, and flash memories. The terms "program" or "software" are used herein in a generic sense to refer to any type of computer code or set of computer-executable instructions that can be employed to program a computer or other processor to implement various aspects of the present invention as discussed above.

Computer-executable instructions may be in many forms; such as program modules, executed by one or more computers or other devices. Generally, program modules include routines, programs, objects, components, data structures that perform particular tasks or implement particular abstract data types. Typically the functionality of the program modules may be combined or distributed as desired in various embodiments.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for analyzing a spiral resonator, comprising the steps of:
   modeling a set of loops of the spiral resonator with a model of a circuit including a set of units, wherein each unit includes a resistor and an inductor to model one loop of the spiral resonator;
   determining values of the resistor and the inductor of each unit based on properties of a corresponding loop;
   modeling electrical connection of the loops by electrically connecting the units in a corresponding order of the loops;
   modeling a capacitive coupling in the spiral resonator by connecting adjacent units with at least one capacitor having a value based on the capacitive coupling between two corresponding adjacent loops;
   modeling an inductive coupling in the spiral resonator based on inductive coupling between pairs of loops; and
   simulating an operation of the spiral resonator with the model of the circuit, wherein steps of the method are performed by a processor.

2. The method of claim 1, further comprising:
   modeling the inductive coupling based on mutual inductance between inductors of the set of units.

3. The method of claim 1, further comprising:
   modeling the capacitive coupling by connecting adjacent units with two capacitors, wherein each capacitor has a value of half of the capacitive coupling between the corresponding adjacent loops, and the capacitor connects ends of the adjacent units corresponding to proximate ends of the adjacent loops.

4. The method of claim 1, further comprising:

approximating shapes of the loops of the spiral resonators; and determining values of components of the model of the circuit based on the approximated shapes of the loops.

5. The method of claim 4, further comprising:

disconnecting the approximated loops while preserving the corresponding order, wherein the corresponding order is an order of connections of the loops in the spiral resonator.

6. The method of claim 1, wherein the spiral resonator is a double resonator having two spirals connected with a via, further comprising:

modeling the via by electrically connecting to units at locations corresponding to connections of the via.

7. A system for analyzing a spiral resonator, comprising:

a processor for simulating an operation of the spiral resonator using a model of a circuit formed by a set of units, wherein each unit includes a resistor and an inductor connected in series, wherein adjacent units are connected with a wire, and wherein the adjacent units are further connected with two capacitors, each capacitor connects proximate ends of the adjacent units.

8. A method for simulating an operation of a spiral resonator, comprising:

representing the spiral resonator as a model of a circuit formed by a set of units corresponding to a set of loops of the spiral resonator, such that each unit includes a resistor and an inductor represents one loop of the spiral resonator, and wherein values of the resistor and the inductor are determined based on geometry and a material property of the loop;

modeling electrical connection of the loops by electrically connecting the units in a corresponding order of the loops;

modeling a capacitive coupling in the spiral resonator by connecting adjacent units with at least one capacitor having a value based on the capacitive coupling between two corresponding adjacent loops; and modeling an inductive coupling in the spiral resonator based on inductive coupling between pairs of loops;

exciting the model of the circuit to analyze the spiral resonator, wherein steps of the method are performed by a processor.

9. The method of claim 8, further comprising:

electrically connecting the units in an order of connection of the corresponding loops.

10. The method of claim 8, wherein the capacitor connects ends of the adjacent units corresponding to proximate ends of the adjacent loops.

* * * * *